(12) United States Patent
Yoo

(10) Patent No.: US 12,740,187 B2
(45) Date of Patent: Sep. 15, 2026

(54) LIGHT EMITTING DEVICE AND APPARATUS HAVING THE SAME

(71) Applicant: SEOUL VIOSYS CO., LTD., Gyeonggi-do (KR)

(72) Inventor: Hong Jae Yoo, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 404 days.

(21) Appl. No.: 18/482,382

(22) Filed: Oct. 6, 2023

(65) Prior Publication Data

US 2024/0154058 A1 May 9, 2024

Related U.S. Application Data

(60) Provisional application No. 63/416,967, filed on Oct. 18, 2022, provisional application No. 63/415,047, filed on Oct. 11, 2022.

(51) Int. Cl.

*H10H 20/811* (2025.01)
*H10H 20/812* (2025.01)
*H10H 20/821* (2025.01)
*H10H 20/825* (2025.01)

(52) U.S. Cl.

CPC ........ *H10H 20/812* (2025.01); *H10H 20/821* (2025.01)

(58) Field of Classification Search

CPC .. H10H 20/812; H10H 20/821; H10H 20/811; H10H 20/825; H10H 20/01335; H10H 20/853; H10H 20/0361; H10H 20/82; H10H 20/018

See application file for complete search history.

(56) References Cited

U.S. PATENT DOCUMENTS

| | | | | |
|---|---|---|---|---|
| 2010/0314642 A1* | 12/2010 | Kudo | H10H 20/018 | 257/E33.068 |
| 2011/0187294 A1* | 8/2011 | Bergmann | H10H 20/811 | 315/363 |
| 2014/0209921 A1* | 7/2014 | Kusunoki | H10H 20/01335 | 438/47 |
| 2021/0399528 A1* | 12/2021 | Park | H01S 5/3407 | |
| 2023/0335576 A1* | 10/2023 | Zhang | H10H 29/142 | |
| 2025/0185417 A1* | 6/2025 | Lex | H10H 20/825 | |

FOREIGN PATENT DOCUMENTS

| | | |
|---|---|---|
| JP | 2008124411 A | 5/2008 |
| JP | 2014143358 A | 8/2014 |
| KR | 100809229 B1 | 3/2008 |
| KR | 20120118055 A | 10/2012 |
| KR | 20170000086 A | 1/2017 |

OTHER PUBLICATIONS

International application No. PCT/KR2023/015488, International Search Report dated Jan. 24, 2024, English Translation, 2 pages.

* cited by examiner

*Primary Examiner* — Omar F Mojaddedi
(74) *Attorney, Agent, or Firm* — LaBatt, LLC

(57) ABSTRACT

A light emitting device and a light emitting apparatus including the same are disclosed. The light emitting apparatus includes a light emitting device and a circuit substrate on which the light emitting device is mounted. The light emitting device includes a first conductivity type semiconductor layer, an active layer disposed on the first conductivity type semiconductor layer, and a second conductivity type semiconductor layer disposed on the active layer, wherein the active layer includes a plurality of sub-active layers having different energy bandgaps.

20 Claims, 16 Drawing Sheets

LIGHT EMITTING DEVICE AND APPARATUS HAVING THE SAME

CROSS-REFERENCE TO RELATED APPLICATIONS

This application claims priority to and the benefit of U.S. Provisional Application No. 63/415,047, filed on Oct. 11, 2022, and U.S. Provisional Application No. 63/416,967, filed on Oct. 18, 2022, each of which is hereby incorporated by reference for all purposes as if fully set forth herein.

TECHNICAL FIELD

The present invention relates to a light emitting device and a light emitting apparatus including the same, and more particularly to a light emitting device having improved luminous efficacy and a light emitting apparatus including the same.

BACKGROUND ART

Generally, a light emitting device is manufactured by forming a semiconductor structure layer, which includes an N-type semiconductor, an active layer, and a P-type semiconductor on a substrate, mesa etching a portion of the semiconductor structure layer to expose a portion of a surface of the N-type semiconductor layer, forming a P electrode and a P pad on the P-type semiconductor layer, and forming an N electrode on the N-type semiconductor layer.

In this case, there is a problem of deterioration in luminous efficacy or light emission efficiency due to imbalance between various components constituting the light emitting device.

DISCLOSURE

Technical Problem

Embodiments of the present invention provide a light emitting device and a light emitting apparatus including the same, which can ensure high efficiency, high performance, stable operation, and reliability.

Technical Solution

In accordance with one aspect of the present invention, a light emitting apparatus includes a light emitting device (100) and a circuit substrate (200) on which the light emitting device (100) is mounted.

In one embodiment, the light emitting device (100) may include a first conductivity type semiconductor layer (130), an active layer (150) disposed on the first conductivity type semiconductor layer (130), and a second conductivity type semiconductor layer (160) disposed on the active layer (150).

In one embodiment, the active layer (150) may include a plurality of sub-active layers (152, 154) having different energy bandgaps.

In one embodiment, the plural sub-active layers (152, 154) may be sequentially disposed from up to down and may have gradually increasing energy bandgaps with decreasing distance to a light emission surface.

In one embodiment, the active layer (150) may include: a first sub-active layer (152) formed on the first conductive-type semiconductor layer (130) and having a first energy bandgap; and a second sub-active layer (154) formed on the first sub-active layer (152) and having a second energy bandgap different from the first energy bandgap.

In one embodiment, the second sub-active layer (154) may have a greater indium content than the first sub-active layer (152).

In one embodiment, the light emitting device (100) may further include a light control layer (140) disposed between the first conductive-type semiconductor layer (130) and the active layer (150) to form a light control structure V within the active layer (150).

In one embodiment, the first conductivity type semiconductor layer (130) may be an n-type semiconductor layer, the second conductivity type semiconductor layer (160) may be a p-type semiconductor layer, and the light emitting device (100) may further include a boundary layer (161) disposed between the active layer (150) and the p-type semiconductor layer and including Al.

In one embodiment, the active layer (150) may have a multi-quantum well (MQW) structure in which barrier layers and well layers are alternately stacked one above another, and the boundary layer (161) may have a smaller thickness than one pair of barrier layer and well layer.

In one embodiment, the boundary layer (161) may have a smaller thickness than the barrier layer.

In one embodiment, the light emitting device (100) may further include a light control layer (140) disposed between the first conductive-type semiconductor layer (130) and the active layer (150) to form a light control structure V within the active layer (150), wherein the light control structure (V) may be a V-shaped groove (V) having a V-shaped cross-section across the active layer (150).

In one embodiment, a maximum width (W) of the V-shaped groove (V) may be greater than a thickness of the first sub-active layer (152).

In one embodiment, a maximum width (W) of the V-shaped groove (V) may be greater than a thickness of the second sub-active layer (154).

In one embodiment, the active layer (150) may have a thickness ranging from 50% to 150% of the maximum width (W) of the V-shaped groove (V).

In one embodiment, the boundary layer (161) may cover a surface of the V-shaped groove (V) to form a boundary between the V-shaped groove (V) and the p-type semiconductor layer.

In one embodiment, an effective index of refraction of the boundary layer (161) may be less than an effective index of refraction of the p-type semiconductor layer.

In one embodiment, the light emitting apparatus may further include a substrate (110) for growth of the first conductive-type semiconductor layer (130), wherein a plurality of protrusions (P) may be formed on one surface of the substrate (110).

In one embodiment, each of the protrusions (P) may include a first protrusion (P1) integrally formed with the substrate (110) and protruding from the one surface of the substrate (110), and a second protrusion (P2) disposed on the first protrusion (P1).

In one embodiment, the active layer (150) may have a thickness ranging from 7% to 15% of a height (H1) of the second protrusion (P2).

In one embodiment, the active layer (150) may have a thickness ranging from 2% to 10% of a maximum width (M) of the second protrusions (P2).

In one embodiment, the second protrusion (P2) may have a different index of refraction than the first protrusion (P1).

In one embodiment, the light emitting device (100) may further include a distributed Bragg reflector (DBR) in which first material layers and second material layers having a higher index of refraction than the first material layers are alternately stacked one above another.

In one embodiment, the distributed Bragg reflector (DBR) may have a thickness ranging from 50% to 250% of a height (H1) of the second protrusion (P2).

In one embodiment, the active layer (150) may further include a tunnel barrier layer (TB) between adjacent sub-active layers (152, 154).

Advantageous Effects

Embodiments of the present invention provide a light emitting device and a light emitting apparatus including the same, which can ensure high efficiency, high performance, stable operation, and reliability.

DESCRIPTION OF DRAWINGS

FIG. 8A and FIG. 8B are cross-sectional views of a light emitting device according to another embodiment of the present invention.

FIG. 11A and FIG. 11B are cross-sectional views of a light emitting apparatus according to another embodiment of the present invention.

DETAILED DESCRIPTION

Figure 1:
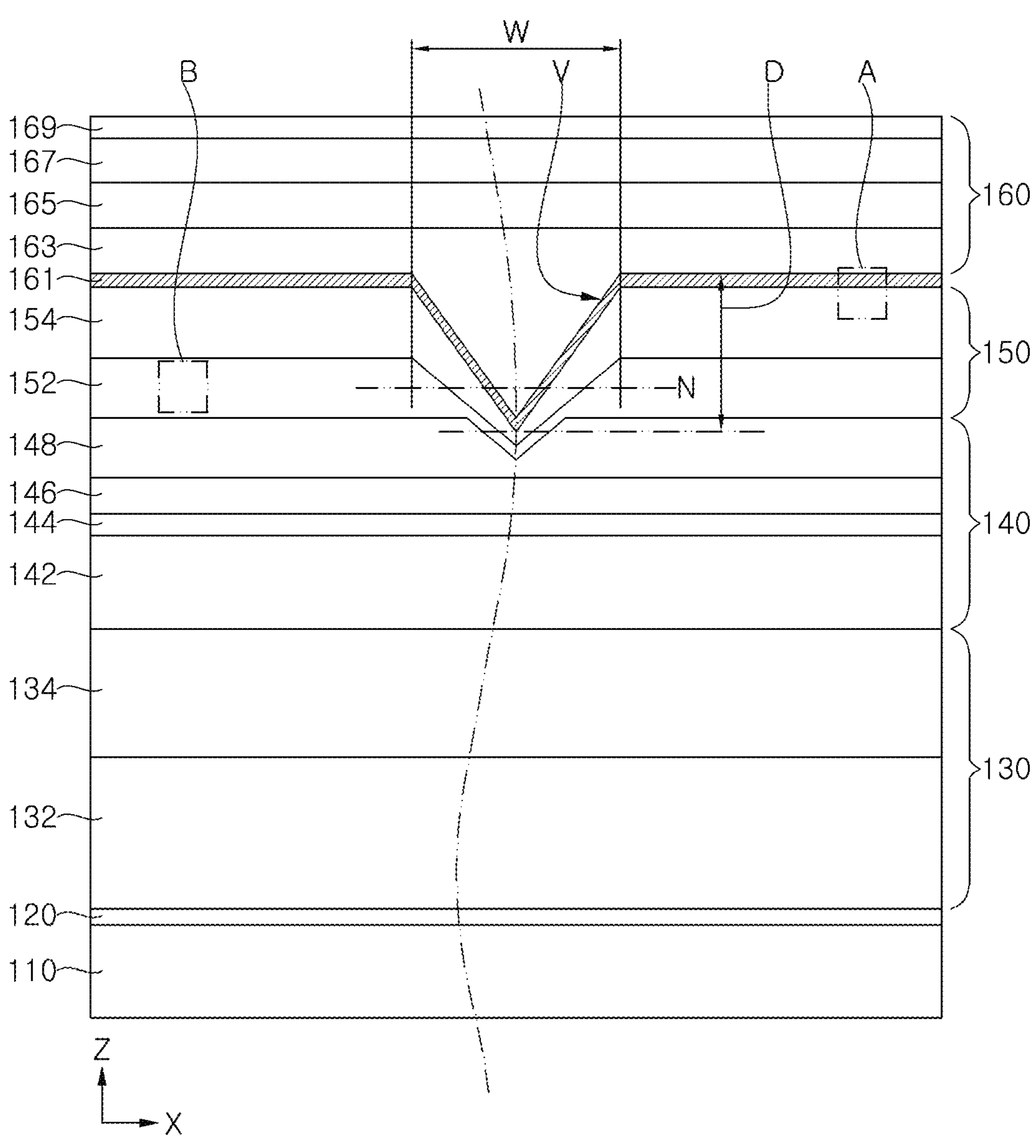
FIG. 1 is a cross-sectional view of a growth layer according to one embodiment of the present invention, which is grown by epitaxial growth.
Figure 2:
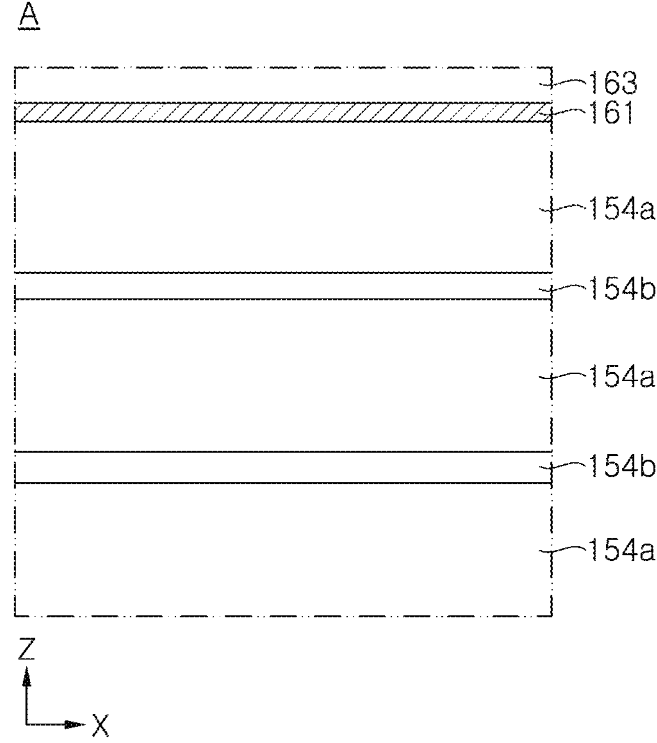
FIG. 2 is an enlarged view of portion A in FIG. 1.
Figure 3:
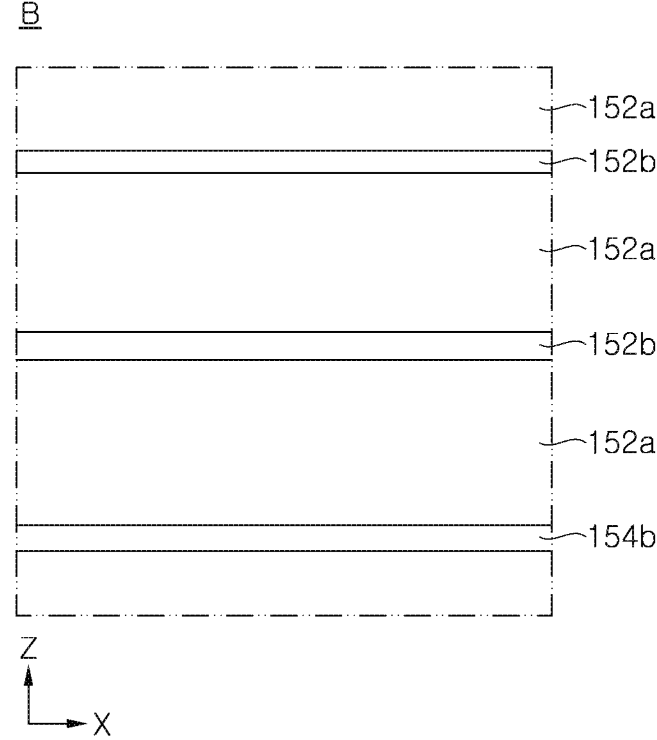
FIG. 3 is an enlarged view of portion B in FIG. 1.

Hereinafter, exemplary embodiments of the present invention will be described with reference to the accompanying drawings. However, it should be understood that the present invention is not limited to particular embodiments disclosed herein and includes all modifications, equivalents and substitutions within the spirit and scope of the invention.

In addition, descriptions of known functions and constructions which may unnecessarily obscure the subject matter of the invention will be omitted Further, when an element is referred to as being "connected to," "supported by," "disposed on," or "stacked on" another element, it should be understood that the element may be directly connected to, supported by, disposed on, or stacked on to the other element or intervening elements may be present The terminology used herein is for the purpose of describing particular embodiments and is not intended to be limiting. As used herein, the singular forms "a," "an," and "the" are intended to include the plural forms as well, unless the context clearly indicates otherwise.

In addition, spatially relative terms, such as "upper," "lower," and the like are defined with reference to the drawings, and may be expressed differently when the orientation is changed. For the same reason, in the accompanying drawings, some components are exaggerated, omitted, or schematically shown, and the dimension of each component is not necessarily indicative of actual dimension.

Although the terms "first," "second," and the like may be used herein to describe various types of elements, these elements should not be limited by these terms. These terms are used to distinguish one element from another element.

Furthermore, the terms "comprises," "comprising," "includes," and/or "including," used in this specification specify the presence of stated features, regions, integers, steps, operations, elements, and/or components, but do not preclude the presence or addition of one or more other features, regions, integers, steps, operations, elements, and/or components.

The present invention provides a light emitting device 100 that includes a first conductivity type semiconductor layer 130, an active layer 150 disposed on the first conductivity type semiconductor layer 130, and a second conductivity type semiconductor layer 160 disposed on the active layer 150. Hereinafter, exemplary embodiments of the present invention will be described in more detail with reference to the accompanying drawings.

The first conductive-type semiconductor layer 130 may be a semiconductor layer grown on one surface of a substrate 110.

The substrate 110 is a growth substrate for epitaxial growth of semiconductor layers, as shown in FIG. 1, and may include, for example, a sapphire ($Al_2O_3$), spinel or silicon carbide substrate, a silicon substrate, or a glass substrate. However, the substrate 110 is not limited to a sapphire substrate and may have any configuration including a variety of light transmissive insulating materials and so long as the substrate allows epitaxial growth.

The substrate 110 is a substrate allowing growth of nitride semiconductors thereon and may include, for example, a heterogeneous substrate, such as a sapphire substrate, a gallium arsenide substrate, a silicon substrate, a silicon carbide substrate, or a spinel substrate, and may also include a homogeneous substrate, such as a gallium nitride substrate, an aluminum nitride substrate, and the like.

Specifically, the substrate 110 may include glass, quartz, silicon, an organic polymer, or an organic-inorganic composite material, and may be a silicon carbide (SiC), gallium nitride (GaN), indium gallium nitride (InGaN), aluminum gallium nitride (AlGaN), aluminum nitride (AlN), gallium oxide (Ga2O3), or silicon substrate.

Figure 5:
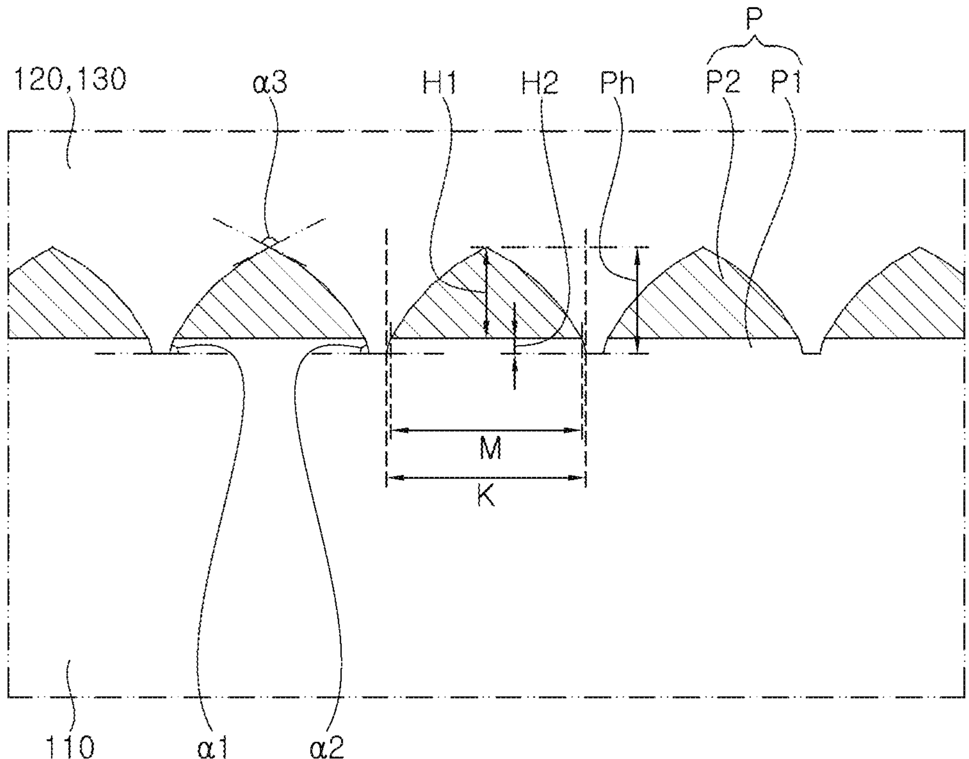
FIG. 5 is an enlarged cross-sectional view of a portion of the configuration shown in FIG. 1.
Figure 6A:
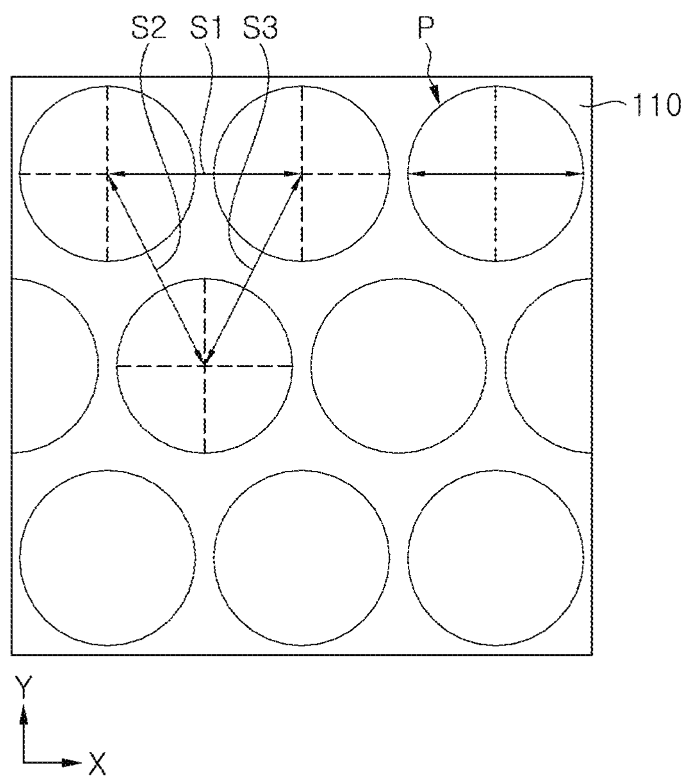
FIG. 6A and FIG. 6B are enlarged plan views of a portion of the configuration shown in FIG. 1.
Figure 6B:
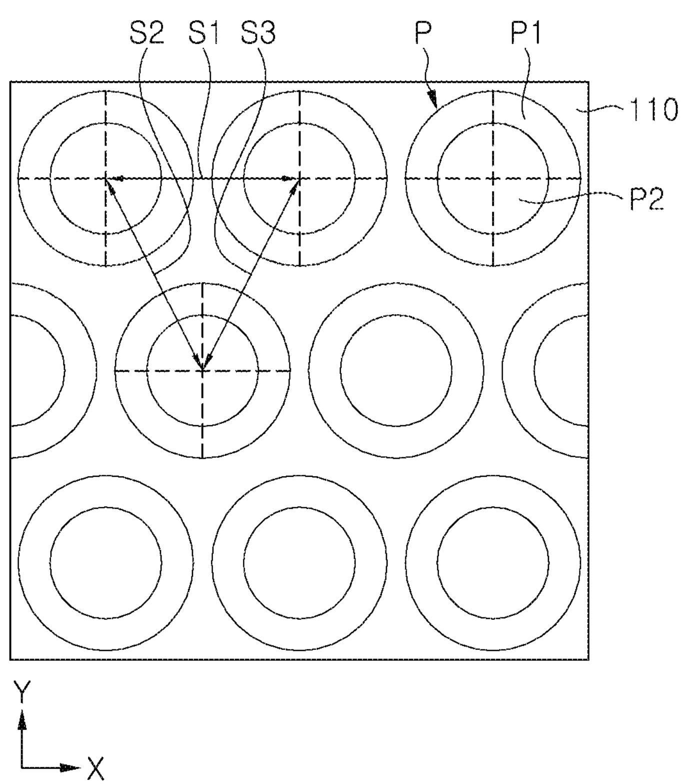

Referring to FIG. 5 to FIG. 6B, a plurality of protrusions P may be formed on one surface of the substrate 110, for example, on a growth surface on which semiconductor layers described below are grown.

The plurality of protrusions P may be formed by a patterned substrate 110 through a photolithography process in which some region of an upper surface of the substrate 110 is etched to a certain depth, without being limited thereto.

Height Ph of the protrusion P refers to a height from the lowest plane of the substrate 110 to the uppermost end of the protrusion P, and may range, for example, from 1 micrometer to 4 micrometers. More preferably, the height Ph of the protrusion P may be in the range of 1.6 micrometers to 2.5 micrometers.

Since the protrusion P is provided in plural, the protrusions P may have different sizes.

The maximum width K of the protrusion P is formed at the lowermost end of the protrusion P and may range, for example, from 2 micrometers to 4 micrometers.

In FIG. 5, an angle $\alpha\mathbf{1}$ at which one side of the protrusion P meets the upper surface of the substrate 110 may be set in various ways and may range, for example, from 30° to 90°. An angle $\alpha\mathbf{2}$ at which the other side of the protrusion P facing the one side thereof meets the upper surface of the substrate 110 may also range, for example, from 30° to 90°. The magnitudes of the angles $\alpha\mathbf{1}$, $\alpha\mathbf{2}$ at which the protrusions P meet the upper surface of the substrate 110 may be the same or different.

An angle $\alpha\mathbf{3}$ formed by two tangential lines intersecting each other at the uppermost end of the protrusion P may be set in various ways and may range, for example, from 70° and 150°.

Obviously, a flat surface may be formed at the uppermost end of the protrusion P.

The protrusions P may be integrally formed with the substrate 110, or at least some region of the protrusion P may be formed of a different material than the substrate 110. That is, as shown in FIG. 5, some region of the protrusion P, for example, an upper region thereof, may be formed of a different material than the substrate 110.

That is, each of the protrusions P may include a first protrusion P1 integrally formed with the substrate 110 and protruding from one surface of the substrate 110, and a second protrusion P2 disposed on the first protrusion P1.

The first protrusion P1 may be a region protruding from the one surface of the substrate 110 to a certain height H2 and integrally formed with the substrate 110. An upper surface of the first protrusion P1 may be formed in various shapes, such as a flat surface, a curved surface, and the like. An inclination of an inclined surface formed on a side surface of the first protrusion P1 may be set in various ways and may vary depending on a location of the protrusion P1, and the inclined surface of the first protrusion may have various shapes, for example, a straight shape, a curved (concave or convex) shape, and the like.

The second protrusion P2 is a protruding portion disposed on the first protrusion P1 and may be formed to cover at least part of the first protrusion P1 or to cover the entirety thereof.

By way of example, the second protrusion P2 may cover 10% to 100% of the first protrusion P1 in plan view. Referring to FIG. 5 to FIG. 6B, the second protrusion P2 may have a width M in the range of 10% to 100% of a width K of the first protrusion P1.

An inclination of an inclined surface formed on a side surface of the second protrusion P2 may be set in various ways and may vary depending on a location of the protrusion P2, and the inclined surface of the second protrusion may have various shapes, for example, a straight shape, a curved (concave or convex) shape, and the like. In addition, the inclination of the inclined surface on the side surface of the second protrusion P2 may be the same as or different from that of the inclined surface on the side surface of the first protrusion P1.

The second protrusion P2 may be formed of a different material from the substrate 110, for example, $SiO_2$. As a result, the second protrusion P2 may have a different index of refraction than the first protrusion P1. By way of example, the index of refraction of the second protrusion P2 may be less than the index of refraction of the first protrusion P1.

The second protrusion P2 is formed of a material having a different index of refraction than the first protrusion P1 and is disposed on the first protrusion P1, whereby light emitted from the light emitting device can be effectively scattered and dispersed through the protrusions P. Furthermore, when light having a plurality of peak wavelengths is generated and emitted, the light having a plurality of peak wavelengths can be effectively scattered and dispersed. In particular, when the light having the plurality of peak wavelengths is blue and green light, the blue and green light can be effectively scattered through the second protrusions P2. Furthermore, clear light can be realized through mixture of the plurality of peak wavelengths.

Next, FIG. 6A is a plan view showing arrangement of the protrusions P on the upper surface of the substrate 110 when the entire protrusions P are protruding regions integrally formed with the substrate 110, and FIG. 6B is a plan view showing arrangement of the protrusions P on the upper surface of the substrate 110 when each of the protrusions P includes the first protrusion P1 and the second protrusion P2.

The plurality of protrusions P may be disposed in a regular pattern or in an irregular pattern on the upper surface of the substrate 110.

Referring to FIG. 6A and FIG. 6B, the plurality of protrusions P may be spaced apart from each other and center distances S1, S2, S3 between neighboring protrusions P may range, for example, from 1.5 μm to 4 μm. It is apparent that, as the plurality of protrusions P is formed on the substrate, the center distances S1, S2, S3 between the neighboring protrusions P may be the same or different.

On the other hand, the protrusions P may have various shapes, such as a dome shape, a conical shape, and the like, and may also have a stepped region with a discontinuous inclination in some zones on the side surface thereof.

On the other hand, since the first conductivity type semiconductor layer 130 is a nitride semiconductor layer and has a lattice mismatch when grown directly on the substrate 110, a buffer layer 120 may be further formed before growth of the first conductivity type semiconductor layer 130 on the substrate 110.

The buffer layer 120 may improve crystallinity of the semiconductor layers grown on the substrate 110 in a subsequent process, and may also act as a seed layer for nitride semiconductor layers to be grown on a heterogeneous substrate.

The buffer layer 120 may include a nitride or phosphide semiconductor and may be formed of, for example, μ-AlGaN, GaN, AlN, or the like, without being limited thereto. However, the buffer layer 120 may be formed of any material allowing higher density nucleation through reduction in interfacial energy than the case of growing the first conductivity type semiconductor layer 130 directly on the substrate 110. The buffer layer 120 may be grown on the substrate 110 by MOCVD.

The first conductivity type semiconductor layer 130 may be a nitride semiconductor layer and may be an n-type semiconductor layer.

The first conductivity type semiconductor layer 130 may include a phosphide or nitride semiconductor, such as (Al, Ga, In)P or (Al, Ga, In)N, and may be formed by growth on the substrate 110 using a growth method, such as MOCVD, MBE, HYPE, or the like.

Further, the first conductivity type semiconductor layer 130 may be doped with at least one n-type dopant, such as Si, C, Ge, Sn, Te, Pb, or the like.

Furthermore, the first conductivity type semiconductor layer 130 may be composed of a single layer or multiple layers. For example, as shown in FIG. 1, the first conductivity type semiconductor layer 130 may include a first sub-conductivity type semiconductor layer 132 and a second sub-conductivity type semiconductor layer 134 disposed on the first sub-conductivity type semiconductor layer 132.

The first sub-conductivity type semiconductor layer 132 and the second sub-conductivity type semiconductor layer 134 may be doped at different concentrations and may be formed at different process temperatures.

Specifically, the first sub-conductive-type semiconductor layer 132 may be a layer formed of n-GaN at a lower doping concentration than undoped-GaN or the second sub-conductive-type semiconductor layer 134, and the second sub-conductive-type semiconductor layer 134 may be a layer that forms ohmic contact with an electrode.

Further, the second sub-conductivity type semiconductor layer 134 may be formed of a nitride material, such as GaN, InGaN, AlGaN, or AlInGaN, and may be a nitride semiconductor layer doped with an n-type dopant.

For example, the second sub-conductivity type semiconductor layer 134 may be a nitride semiconductor layer doped with at least one of Si, Te, B, P, As, Sb, or the like.

On the other hand, when the first conductivity type semiconductor layer 130 is composed of multiple layers, the first conductivity type semiconductor layer 130 may include a super-lattice layer.

Furthermore, the first conductivity type semiconductor layer 130 may further include a contact layer, a modulation doping layer, an electron implantation layer, or the like.

The active layer 150 is a light-emitting layer disposed on the first conductive-type semiconductor layer 130 and may have a quantum well (QW) structure.

The active layers 124, 134, 144 may include a phosphide or nitride semiconductor, such as (Al, Ga, In)P or (Al, Ga, In)N, and may be grown on the first conductivity type semiconductor layer 130 by a growth method, such as MOCVD, MBE, HYPE, or the like.

Further, the active layer 150 may include a quantum well (QW) structure including at least two barrier layers and at least one well layer, and may further include a multi-quantum well (MQW) structure including a plurality of barrier layers and a plurality of well layers.

The wavelength of light emitted from the active layer 150 may be adjusted by controlling the amounts of materials constituting the well layer. In this case, the well layers may commonly contain the same element, for example, indium (In).

The well layer is disposed between the barrier layers and has a smaller energy bandgap than the barrier layer.

The well layer may contain or may be formed of $In_xGa_{1-x}N$ or $In_xGa_{1-x}P$ ($0<x<1$) and the wavelength of light emitted from the active layer may be controlled by the content (x) of In.

The barrier layers and the well layers are alternately stacked one above another, preferably at least twice. A barrier layer and a well layer adjacent the barrier layer may form a pair. As the active layer 150 has the multi-quantum well (MQW) structure in which the barrier layers and the well layers each corresponding to a very thin light emitting layer are alternately stacked one above another, binding efficiency of electrons and holes can be increased quantum mechanically.

Here, the active layer 150 may include a plurality of sub-active layers 152, 154 having a multi-quantum well (MQW) structure that emits light with different peak wavelengths, as shown in FIG. 1.

Although FIG. 1 illustrates an example in which the active layer 150 includes two sub-active layers 152, 154, it should be understood that other implementations are possible and the active layer may include three or more sub-active layers in other embodiments.

By way of example, the active layer 150 may include a first sub-active layer 152 formed on the first conductivity type semiconductor layer 130 and having a first energy bandgap, and a second sub-active layer 154 formed on the first sub-active layer 152 and having a second energy bandgap different from the first energy bandgap. The first sub-active layer 152 may generate light having a first wavelength (or a first peak wavelength) and the second sub-active layer 154 may generate light having a second wavelength (or a second peak wavelength) different from the first wavelength.

The first sub-active layer 152 may include a plurality of pairs of barrier layers **152*a* and well layers 152*b***.

Figure 4:
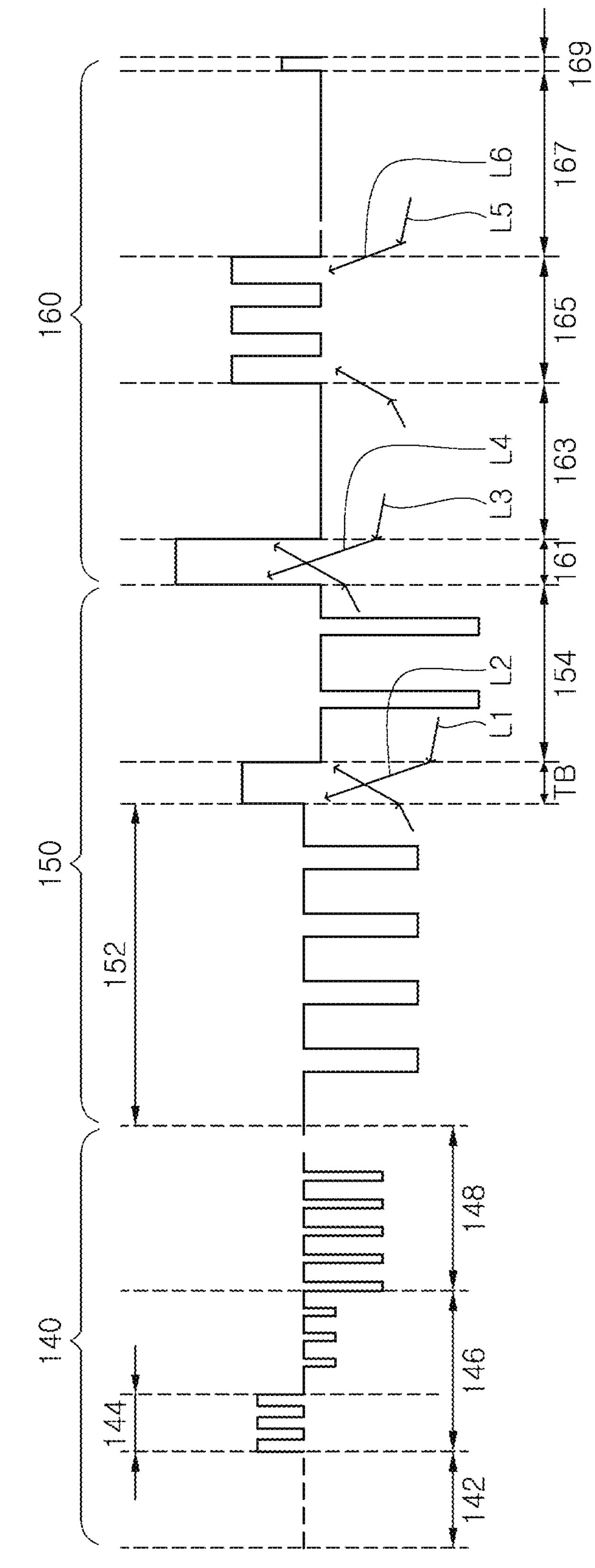
FIG. 4 is a diagram depicting energy bandgap of the growth layer of FIG. 1.

For example, referring to FIG. 4, the first sub-active layer 152 may be composed of four pairs of barrier layers **152*a* and well layers 152*b***, without being limited thereto.

The second sub-active layer 154 is an active layer that generates light having a second peak wavelength different from the first peak wavelength, and may include a plurality of pairs of barrier layers **154*a* and well layers 154*b***.

Alternatively, the second sub-active layer 154 is an active layer that generates light in a second wavelength band different from the first wavelength band and may include a plurality of pairs of barrier layers **154*a* and well layers 154*b***.

For example, referring to FIG. 4, the second sub-active layer 154 may include two pairs of barrier layers **154*a* and well layers 154*b***, without being limited thereto.

With different energy bandgaps, the first sub-active layer 152 and the second sub-active layer 154 may generate light having different peak wavelengths. With this structure, the active layer can realize light having a wide range of wavelengths through combination of light generated from the first sub-active layer 152 and light generated from the second sub-active layer 154. Alternatively, the light emitting device according to this embodiment may realize various colors including white light through adjustment in energy bandgap and thus does not require a separate wavelength conversion layer (phosphor).

Although FIG. 1 illustrates that the first sub-active layer 152 is placed under the second sub-active layer 154 such that the first sub-active layer 152 is closer to the first conductive-type semiconductor layer 130 than the second sub-active layer 154, it should be understood that the present invention is not limited thereto.

The first sub-active layer 152 and the second sub-active layer 154 may have different contents of indium (In). By way of example, the indium content of the second sub-active layer 154 may be greater than the indium content of the first sub-active layer 152, without being limited thereto. Alternatively, depending on the structure of the light emitting device 100, the indium content of the first sub-active layer 152 may be greater than the indium content of the second sub-active layer 154. A difference in indium (In) content between the first sub-active layer 152 and the second sub-active layer 154 may be 1.5% or more.

By way of example, the first sub-active layer 152 may have an indium (In) content of 5% to 20% and light emitted from the first sub-active layer 152 may include light in the blue (or violet) wavelength band. Here, the light generated from the first sub-active layer 152 may have a peak wavelength in the range of 410 nm to 465 nm.

The second sub-active layer 152 is an active layer disposed close to the second conductive-type semiconductor layer 160 and may have an indium (In) content of 15% to 30%, and light emitted from the second sub-active layer 152 may include light in the green wavelength band. The light generated from the second sub-active layer 154 may have a peak wavelength in the range of 440 nm to 560 nm.

A difference between the wavelength of light emitted from the first sub-active layer 152 and the wavelength of light emitted from the second sub-active layer 154 may be in the range of 10 nm to 145 nm.

The wavelength of light emitted from the second sub-active layer 154 may be longer than the wavelength of light emitted from the first sub-active layer 152, without being limited thereto. Alternatively, depending on the structure of the light emitting device 100, the wavelength of light emitted from the second sub-active layer 154 may be shorter than the wavelength of light emitted by the first sub-active layer 152.

The plurality of sub-active layers 152, 154 may be disposed from up to down in various sequences. More preferably, the closer the sub-active layers are to a light exit surface of the light emitting device 100 through which light is emitted from the light emitting device 100, the greater the energy bandgap.

That is, the sub-active layer 152 or 154 having a greater energy bandgap may be disposed closer to the light exit surface. In other words, the sub-active layer 152 or 154 generating high energy light with a shorter wavelength may be disposed closer to the light exit plane.

In another embodiment, depending on the wavelength characteristics of light generated from the plurality of sub-active layers 152, 154, white light can be realized even without a separate wavelength conversion layer formed on a light emitting diode package, thereby preventing gradual changes in color and color coordinates due to deterioration of the wavelength conversion layer over time in operation of the light emitting device.

Optionally, the active layer 150 may further include a tunnel barrier layer TB acting as an intermediate barrier layer between the sub-active layers 152, 154.

The tunnel barrier layer TB can prevent light generated and emitted from the first sub-active layer 152 from being absorbed by the second sub-active layer 154, which has a lower energy bandgap than the first sub-active layer 152.

Thus, the light emitted from the first sub-active layer 152 can be allowed to be emitted without interference with the second sub-active layer 154.

Further, since the tunnel barrier layer TB having a lower effective index of refraction than the first sub-active layer 152 and the second sub-active layer 154 is disposed between the first sub-active layer 152 and the second sub-active layer 154, light L1 emitted from each of the sub-active layers 152, 154 and incident on the tunnel barrier layer TB is refracted at a greater angle than an incidence angle thereof and passes through the tunnel barrier layer L2. Accordingly, light generated from the first sub-active layer 152 and the second sub-active layer 154 and having different wavelengths can lengthen an optical path L2 passing through the tunnel barrier layer TB, thereby causing mixture of light having different wavelengths inside the semiconductor layer.

When L denotes the thickness of the active layer 150, H1 denotes the height of the second protrusion P2 described above, and M denotes the maximum width of the second protrusion P2, the thickness L of the active layer 150 may be in the range of 7% to 15% of the height H1 of the second protrusion P described above. In addition, the total thickness L of the active layer 150 may be in the range of 2% to 10% of the maximum width M of the second protrusion P2. Thus, light can be effectively emitted through a thickness relationship advantageous for light extraction.

Further, the second sub-active layer 154 is an active layer having a smaller energy bandgap than the first sub-active layer 152 and may be formed to a thickness ranging from one to three times that of the first sub-active layer 152.

The light emitting device 100 according to the embodiment of the invention may further include a light control layer 140 disposed between the first conductive-type semiconductor layer 130 and the active layer 150 to form a light control structure V within the active layer 150, as shown in FIG. 1.

Here, the light control structure V may be a V-shaped groove V having a V shaped cross-section across the active layer 150. The V-shaped groove V is shown in FIG. 1 and may be formed in a trench shape having a maximum width W at an upper portion thereof and a depth D. The V-shaped groove V may be provided in plural and may be distributed in various patterns.

The V-shaped grooves V may be formed in an appropriate size and number by the light control layer 140. The V-shaped grooves V formed by the light control layer 140 may be formed to gradually increase in size within the active layer 150, and a side inclination of the V-shaped grooves V may be kept constant to relieve strain at an interface thereof.

In this case, when an electrical surge or shock is introduced into the light emitting device 100, the active layer 150 can be effectively protected by allowing efficient dispersion of the electrical surge or shock through regions formed with the V-shaped grooves V.

Further, a boundary surface of the V-shaped groove V may be subjected to sufficient passivation with a boundary layer 161 described below, thereby effectively protecting an actual light-emitting area of the active layer 150 while preventing damage caused by electrostatic discharge (ESD).

The light control layer 140 is disposed between the first conductivity type semiconductor layer 130 and the active layer 150 to form the light control structure V in the active layer 150, and may act as a seed for forming the light control structure V.

The light control layer 140 may have a multilayer structure in which plural layers having different lattices or different energy bandgaps are alternately stacked one above another. For example, the light control layer 140 may be a multilayer structure in which GaN layers and InGaN layers are alternately stacked one above another.

Specifically, the light control layer 140 may include a seed layer 142 including GaN on the first conductive-type semiconductor layer 130.

The seed layer 142 is grown at a rate of 1 to 5 Å/sec at a lower temperature than the first conductivity type semiconductor layer 130 (for example, at a growth temperature of 700° C. to 900° C., more preferably at 750° C. to 850° C.), and may be formed to a thickness of 200 nm or less, for example, a thickness of 150 nm to 200 nm.

The thickness of the seed layer 142 may be in the range of 7.5% to 20% of the thickness of the first conductivity type semiconductor layer 130. This structure enables formation of the light control structure V in a suitable size while improving peak generation accuracy of the short wavelength active layer for forming a plurality of peaks.

The size and density of the light control structure V may be controlled by the seed layer 142.

The light control layer 140 may further include a first super-lattice layer 146, 148 disposed on the seed layer 142. The first super-lattice layer 146, 148 may be provided in plural to form a multilayer structure.

The first super-lattice layer 146, 148 has a super-lattice (SL) structure and may be formed by periodically stacking InGaN, GaN, InGaN/GaN, InGaN/AlGaN, AlGaN/AlGaN, AlGaN/GaN, InAlGaN/GaN, or InAlGaN/InAlGaN layers.

That is, the first super-lattice layer 146, 148 is formed by repeatedly stacking layers having different lattices. For example, the first super-lattice layer 146, 148 may be formed by periodically stacking InGaN/GaN layers with an indium (In) content that provides a wavelength of 405 nm or less.

The indium (In) content of InGaN may range from 2% to 8%. More specifically, the indium (In) content of InGaN may range from 2% to 5% or from 5% to 8%.

An average indium content of the first super-lattice layers 146, 148 may be higher than that of the seed layer 142, as an example 2% to 8% higher than that of the seed layer 142.

In addition, layers constituting the first super-lattice layer 146, 148 may include the same material as a layer constituting the seed layer 142. The same material may be a material having a higher bandgap than light generated from the active layer 150. For example, the same material may be GaN.

The first super-lattice layer 146, 148 may be grown at a slower rate than the seed layer 142. For example, the first super-lattice layer 146, 148 may be formed at a rate of 1 Å/sec or less.

Triethyl gallium (TEGa) having a low carbon content may be used as a precursor source for Ga in order to reduce the growth rate of the first super-lattice layer 146, 148 while minimizing introduction of impurities, such as carbon, oxygen, or hydrogen.

As the growth rate is reduced using triethyl gallium (TEGa), the light control structure V can be formed more uniformly in size and density.

The first super-lattice layer 146, 148 may have a thickness of about 80 nm or less, for example, from 20 nm to 80 nm. More specifically, at least one InGaN layer may have a thickness of 15 Å to 25 Å and at least one GaN layer may have a thickness of 75 Å to 85 Å.

When InGaN/GaN layers are formed in a total of three pairs in a repeatedly stacked structure of InGaN/GaN, the first super-lattice layer 146, 148 may have a thickness of 20 nm to 40 nm, more specifically 270 Å to 330 Å.

In another example, a total of five pairs of InGaN/GaN may also be disposed. When the InGaN/GaN layers are disposed in a total of five pairs in the repeatedly stacked structure of InGaN/GaN, the first super-lattice layer 146, 148 may have a thickness of 40 nm to 80 nm, more specifically 450 Å to 550 Å. It should be noted that, in the first super-lattice layer 146, 148, the thicknesses of the InGaN layer and the GaN layer and the number of pairs of InGaN/GaN layers are not limited thereto and may be set in various ways so long as the light control structure V capable of playing an effective role in anti-ESD characteristics and light extraction can be formed thereby.

The thickness of the first super-lattice layer 146, 148 may be less than or equal to the thickness of the active layer 150.

The first super-lattice layer 146, 148 may be doped with Si and may have a dopant concentration of 1E17 to 1E18 atoms/cm$^3$. However, it should be understood that other implementations are possible and the first super-lattice layer may not be doped with any dopant.

Further, the first super-lattice layer 146, 148 may be formed at a growth temperature equal to or higher than the growth temperature of the seed layer 142. For example, the first super-lattice layer 146, 148 may be formed at 800° C. to 950° C., more preferably at a growth temperature of 850° C. to 950° C.

In one embodiment, the first super-lattice layer 146, 148 may be a single layer or may be composed of two or more multiple layers. For example, the first super-lattice layer 146, 148 may include a 1-1st super-lattice layer 146 and a 1-2nd super-lattice layer 148, in which GaN and InGaN are alternately stacked one above another, as shown in FIG. 1.

The 1-1st super-lattice layer 146 may have 3 pairs of GaN and InGaN and may be formed to a thickness of 25 nm to 35 nm, without being limited thereto.

The 1-2nd super-lattice layer 148 may have 5 pairs of GaN and InGaN and may be formed to a thickness of 45 nm to 55 nm, without being limited thereto.

The 1-2nd super-lattice layer 148 may have a greater indium content than the 1-1st super-lattice layer 146.

The 1-1st super-lattice layer 146 is disposed on the seed layer 142 and may have an average indium content of 2% to 5%. Here, the average indium content of the 1-1st super-lattice layer 146 may be about 2% to 8% greater than the average indium content of the seed layer 142.

In addition, layers constituting the 1-1st super-lattice layer 146 may include the same material as the layer constituting the seed layer 142. The same material may have a higher bandgap than light generated from the active layer 150. For example, the same material may be GaN.

The 1-1st super-lattice layer 146 may be grown at a slower rate than the seed layer 142. For example, the 1-1st super-lattice layer 146 may be formed at a rate of 1 Å/sec or less. Triethyl gallium TEGa having a low carbon content may be used as a precursor source for Ga in order to reduce the growth rate of the 1-1st super-lattice layer 146 while minimizing introduction of impurities, such as carbon, oxygen, or hydrogen, into the 1-1st super-lattice layer 146. As the growth rate is reduced, the light control structure V can be formed more uniformly in size and density, thereby effectively improving anti-ESD characteristics and light extraction efficiency.

The 1-1st super-lattice layer 146 may have a thickness of about 40 nm or less, for example, 20 nm to 40 nm. More specifically, in the 1-1st super-lattice layer 146, at least one InGaN layer may have a thickness of 15 Å to 25 Å and at least one GaN layer may have a thickness of 75 Å to 85 Å. When a total of three pairs of InGaN/GaN is formed in the repeatedly stacked structure of InGaN/GaN, the 1-1st super-lattice layer 146 may have a thickness of 270 Å to 330 Å.

The 1-1st super-lattice layer 146 may be formed at a growth temperature equal to or higher than the growth temperature of the seed layer 40. For example, the 1-1st super-lattice layer 146 may be formed at a growth temperature of 800° C. to 950° C., more preferably 850° C. to 950° C. In addition, the 1-1st super-lattice layer 146 may be doped with Si and may have a dopant concentration of 1E17 to 1E18 atoms/cm$^3$.

The 1-2nd super-lattice layer 148 is a super-lattice layer disposed on the 1-1st super-lattice layer 146 and may have a similar structure to the 1-1st super-lattice layer 146.

The 1-2nd super-lattice layer 148 may also be formed by periodically stacking InGaN, GaN, or InGaN/GaN layers. That is, layers having different lattices may be repeatedly stacked one above another.

The 1-2nd super-lattice layer 148 may include a greater indium content than the 1-1st super-lattice layer 146. For example, in the 1-2nd super-lattice layer 148, InGaN may have an indium content of 5% to 8%.

Further, the sum of the indium contents of the 1-1st super-lattice layer 146 and the 1-2nd super-lattice layer 148 may be less than the sum of the indium contents of the first sub-active layer 152 and the second sub-active layer 154.

Like the 1-1st super-lattice layer 146, the growth rate of the 1-2nd super-lattice layer 148 may also be slower than that of the seed layer 142. For example, the 1-2nd super-lattice layer 148 may be formed at a rate of 1 Å/sec or less. Triethyl gallium (TEGa) having a low carbon content may be used as a precursor source for Ga in order to reduce the growth rate of the 1-2nd super-lattice layer 148 while minimizing introduction of impurities, such as carbon, oxygen, or hydrogen, into the 1-2nd super-lattice layer 148. As the growth rate is reduced, the light control structure V can be formed more uniformly in size and density.

Further, the thickness of the 1-2nd super-lattice layer 148 may be greater than the thickness of the 1-1st super-lattice layer 146. The thickness of the 1-2nd super-lattice layer 148 may be in the range of 80 nm or less, for example from 40 nm to 80 nm. More specifically, in the 1-2nd super-lattice layer 148, at least one InGaN layer may have a thickness of 15 Å to 25 Å and at least one GaN layer may have a thickness of 75 Å to 85 Å.

When a total of five pairs of InGaN/GaN is formed in the repeatedly stacked structure of InGaN/GaN, the 1-2nd super-lattice layer 148 may have a thickness of 450 Å to 550 Å. Thus, the thickness of the 1-2nd super-lattice layer 148 may be greater than the thickness of the 1-1st super-lattice layer 146.

Further, the sum of the thicknesses of the 1-1st super-lattice layer 146 and the 1-2nd super-lattice layer 148 may be equal to or less than the sum of the thicknesses of the first sub-active layer 152 and the second sub-active layer 154.

The growth temperature of the 1-2nd super-lattice layer 148 may be the same as or different from the growth temperature of the 1-1st super-lattice layer 146.

The 1-1st and 1-2nd super-lattice layers 146, 148 may be formed at a growth temperature equal to or higher than the growth temperature of the seed layer 142. For example, the 1-1st and 1-2nd super-lattice layers 146, 148 may be formed at a growth temperature of 800° C. to 950° C.

The light control structure V generated from the seed layer 142 may be formed through a structure in which the content of indium gradually increases with decreasing distance to the active layer 150, that is, through a structure in which the indium content of the 1-1st super-lattice layer 146 is greater than the indium content of the 1-2nd super-lattice layer 148. Accordingly, the light control structure V within the active layer 150 may be formed in a suitable size. That is, the V-shaped grooves V may be formed to a width w and a height D in the range of 300 nm or 350 nm and may be uniformly distributed in the active layer 150. Such a shape of the V-shaped grooves V can effectively protect the light emitting layer within the active layer 150 from ESD while further improving light extraction efficiency.

More specifically, the maximum width W of an upper end of the V-shaped groove V may be greater than the thickness of the first sub-active layer 152 and the thickness of the second sub-active layer 154. Furthermore, the sum of the thicknesses of the first sub-active layer 152 and the second sub-active layer 154 may be in the range of 50% to 150% of the maximum width W of the V-shaped groove V. Accordingly, light generated from the active layer 150 may be diffused by surface grooves formed by the grooves V to be effectively discharged outside.

Furthermore, the maximum width W of the upper end of the V-shaped groove V may be formed in a size greater than 10% of the height H1 of the second protrusion P2 and less than 10% of the maximum width M of the second protrusion P2. Accordingly, it is possible to achieve effective refraction and diffusion of light through the respective surface grooves formed on upper and lower portions relative to the active layer 150.

The light control layer 140 may further include a second super-lattice layer 144 disposed between the seed layer 142 and the super-lattice layers 146, 148 and formed by alternately stacking GaN and AlN one above another.

The second super-lattice layer 144 is a layer disposed between the seed layer 142 and the first super-lattice layer 146, 148 and may have various configurations.

The second super-lattice layer 144 may be disposed between the first super-lattice layer 146, 148 and the seed layer 142 to allow growth of the V-shaped grooves V generated from the seed layer 142 without deformation. For example, the second super-lattice layer 144 may be formed in a structure of supper lattices (SLs) of AlN/GaN.

The second super-lattice layer 144 may have a thickness of about 25 nm or less, for example 15 nm to 25 nm. More specifically, in the second super-lattice layer 144, at least one AlN layer may have a thickness of 15 Å to 25 Å and at least one GaN layer may have a thickness of 45 Å to 55 Å.

When a total of three pairs of AlN/GaN are formed in the repeatedly stacked structure of AlN/GaN, the light control layer 140 may have a thickness of 180 Å to 240 Å.

The growth rate of the second super-lattice layer 144 may be slower than the seed layer 142. For example, the second super-lattice layer 144 may be formed at a rate of 1 Å/sec or less.

Triethyl gallium (TEGa) having a low carbon content may be used as a precursor source for Ga in order to form the V-shaped grooves V in a more uniform size and density through reduction in growth rate thereof. As a result, the V-shaped grooves V may be formed more uniformly in size and density, thereby effectively improving anti-ESD characteristics while improving light extraction efficiency.

Further, the second super-lattice layer 144 may be formed at a growth temperature equal to or higher than the growth temperature of the seed layer 142, for example, at a growth temperature of 800° C. to 950° C., more preferably 850° C. to 950° C.

In addition, the second super-lattice layer 144 may be doped with Si and may have a dopant concentration of 1E17 to 1E18 atoms/cm$^3$.

Accordingly, the 1-1st super-lattice layer 146 may be disposed on the second super-lattice layer 144 and the 1-2nd super-lattice layer 148 may be disposed on the 1-1st super-lattice layer 146.

The overall thickness of the light control layer 140 including the second super-lattice layer 144 and the first super-lattice layer 146, 148, may be less than the thickness of the active layer 150.

The active layer 150 may be disposed on the light control layer 140 and the second conductivity type semiconductor layer 160 may be disposed on the active layer 150.

The second conductivity type semiconductor layer 160 is a semiconductor layer disposed on the active layer 150 and may be a p-type semiconductor layer. That is, the p-type semiconductor layer may be disposed on the V-shaped grooves V, which gradually increase in size, within the active layer 150.

The second conductivity type semiconductor layer 160 may include a phosphide or nitride semiconductor, such as (Al, Ga, In)P or (Al, Ga, In)N, and may be grown by a growth method, such as MOCVD, MBE, HVPE, or the like.

The second conductivity type semiconductor layer 160 may be doped with a conductivity type dopant opposite to the conductivity type dopant of the first conductivity type semiconductor layer 130. For example, the second conductivity type semiconductor layer 160 may be doped with a p-type dopant, such as Mg.

The p-type semiconductor layer may have a single layer or multilayer structure having a composition, such as p-GaN, without being limited to a particular structure.

By way of example, the p-type semiconductor layer may include p-GaN and may include a first p-type semiconductor layer 163 that is a nitride semiconductor layer doped with a p-type dopant. The first p-type semiconductor layer 163 may be a semiconductor layer doped with a p-type dopant, such as Mg or carbon.

The first p-type semiconductor layer 163 may include Mg and/or carbon or may include other p-type dopants. Mg doped in the first p-type semiconductor layer 163 may form agglomerated magnesium lumps. The lumps may be formed as a plurality of lumps spaced apart from each other or as at least two lumps joined to each other. The lumps may have different sizes or different shapes.

Further, the first p-type semiconductor layer 163 may have a dopant concentration of 1E20 atoms/$cm^3$ or more. The first p-type semiconductor layer 163 may have a thickness of 100 Å to 300 Å, preferably 120 Å to 180 Å. The first p-type semiconductor layer 163 may be grown at a temperature of 700° C. to 850° C., without being limited thereto.

In addition, the light emitting device may further include an electron blocking layer (EBL) having a high bandgap under the first p-type semiconductor layer 163. The electron blocking layer serves to prevent electrons from overflowing from the active layer 150 to an upper portion thereof. The electron blocking layer EBL may also serve to prevent electrons escaping from the active layer 150 from combining with holes present in the p-type semiconductor layer 160 to generate light other than a target wavelength or a wavelength required to achieve a target color. The electron blocking layer (EBL) may be, for example, an AlGaN layer to create a high bandgap. The electron blocking layer EBL may include a lump.

The p-type semiconductor layer may further include a second p-type semiconductor layer 165 on the first p-type semiconductor layer 163.

The second p-type semiconductor layer 165 may be a single layer or multiple layers. For example, the second p-type semiconductor layer 165 may have a structure of supper lattices (SLs).

Specifically, the second p-type semiconductor layer 165 may be a nitride semiconductor layer having a super-lattice structure in which at least one layer includes Al.

The second p-type semiconductor layer 165 may be formed by periodically stacking AlGaN/GaN layers. In the second p-type semiconductor layer 165, layers having different lattices may be repeatedly stacked one above another.

Among the layers in the second p-type semiconductor layer 165, a layer having a smaller energy bandgap may have an energy bandgap difference of 0.5 eV or less from the energy bandgap of the first p-type semiconductor layer 163, and an energy bandgap difference of 0.5 eV or less from the energy bandgap of a third p-type semiconductor layer 167 described below.

Further, in the second p-type semiconductor layer 165, a layer have a larger energy bandgap may have an energy bandgap difference of 0.5 eV or less from the energy bandgap of a boundary layer 161 described below.

Further, the second p-type semiconductor layer 165 may include a grading section in which the Al content decreases. In the grading section, the Al composition of an AlGaN layer of the second p-type semiconductor layer 165 may vary from a high composition to a low composition.

For example, in the AlGaN layer, the Al composition may be set to a gradually decreasing gradient from 35% to 5%. However, it should be understood that various implementations including a stepwise decreasing gradient are possible and the Al composition in the AlGaN layer may vary in the range of 5% to 35%.

Further, the second p-type semiconductor layer 165 may be undoped with any p-type dopant, without being limited thereto.

The second p-type semiconductor layer 165 may have a thickness of 150 Å to 300 Å and may be formed at a growth temperature of 800° C. to 950° C. However, it should be understood that various implementations are possible.

The p-type semiconductor layer may further include the third p-type semiconductor layer 167 on the second p-type semiconductor layer 165.

The third p-type semiconductor layer 167 may be a layer formed of p-GaN doped with a p-type dopant. The third p-type semiconductor layer 167 may further contain a small amount of Al.

The third p-type semiconductor layer 167 may have the same composition as the first p-type semiconductor layer 163. For example, the third p-type semiconductor layer 167 may also be formed as a semiconductor layer doped with a p-type dopant, such as Mg or carbon.

The third p-type semiconductor layer 167 may include Mg and/or carbon. However, it should be understood that other implementations are possible and the third p-type semiconductor layer may include other p-type dopants.

The third p-type semiconductor layer 167 may have a dopant concentration of 5E19 atoms/$cm^3$ or less, preferably 1E19 atoms/$cm^3$ or less.

Upon growth of the third p-type semiconductor layer 167, H2 gas may be used as a carrier gas.

Further, the third p-type semiconductor layer 167 may have a thickness of 150 Å to 300 Å and the thickness of the third p-type semiconductor layer 167 may be in the range of ±15% of the thickness of the first p-type semiconductor layer 163.

The third p-type semiconductor layer 167 may be formed at a growth temperature of 900° C. to 1000° C., without being limited thereto.

Referring to FIG. 1, the third p-type semiconductor layer 167 may act as a V-pit covering layer (VCL) that fills and covers a depressed space of the V-shaped groove V. As a result, the third p-type semiconductor layer 167 may have a flat upper surface.

The light emitting device 100 according to the embodiment includes the P-type semiconductor layer 160 in which AlGaN/GaN layers are alternately stacked on an upper surface of a high-resistance boundary layer 161 to improve passivation of the V-shaped grooves V, thereby achieving significant improvement in anti-ESD characteristics in the layer-junction structure including multiple sub-active layers 152, 154.

The p-type semiconductor layer may further include a fourth p-type semiconductor layer 169 on the third p-type semiconductor layer 167.

The fourth p-type semiconductor layer 169 may be a layer formed of p-GaN doped with a p-type dopant.

The fourth p-type semiconductor layer 169 may have a p-type dopant concentration of 1E20 atoms/$cm^3$ or more. For example, the fourth p-type semiconductor layer 169 may be a semiconductor layer doped with a p-type dopant, such as Mg or carbon.

The fourth p-type semiconductor layer 169 may include Mg and/or carbon.

In other embodiments, the fourth p-type semiconductor layer 169 may be p-type doped p-AlGaN and may have a p-type dopant concentration of 1E20 atoms/$cm^3$ or more.

The fourth p-type semiconductor layer 169 may have an Al content of 2% to 5%, preferably 3% or less.

The fourth p-type semiconductor layer 169 is an uppermost layer of an epitaxial structure formed to act as a contact layer and may have a thickness of 50 Å to 150 Å. In addition, the fourth p-type semiconductor layer 169 may be formed at a growth temperature of 900° C. or less, without being limited thereto.

On the other hand, the light emitting device 100 may further include an Al-containing boundary layer 161 between the active layer 150 and the p-type semiconductor layer.

The boundary layer 161 is a layer that covers the surfaces of the V-shaped grooves V within the active layer 150 to form a boundary between the V-shaped grooves V and the p-type semiconductor layer, and may have various configurations.

Specifically, the boundary layer 161 may include a nitride semiconductor layer containing Al. More specifically, the boundary layer 161 may include aluminum nitride (AlN) having high resistance.

The boundary layer 161 may have a thickness of 15 Å to 50 Å and may be formed at a growth temperature of 800° C. to 950° C.

The boundary layer 161 is formed on the last barrier layer of the active layer 150, covers the surfaces of the V-shaped grooves V to form a layer with high resistance, and may be subjected to electrostatic passivation to improve ESD characteristics.

On the other hand, the boundary layer 161 may have a lower index of refraction than the second sub-active layer 154 and the p-type semiconductor layer.

More specifically, the index of refraction of the boundary layer 161 may be less than the indices of refraction of the second sub-active layer 154 and the first p-type semiconductor layer 163. In addition, the index of refraction of the second p-type semiconductor layer 165 may be less than the indices of refraction of the first p-type semiconductor layer 163 and the third p-type semiconductor layer 167. The boundary layer 161 having a small index of refraction may be disposed between the second sub-active layer 154 and the first p-type semiconductor layer 163, and the second p-type semiconductor layer 165 having a small effective index of refraction may be disposed between the first p-type semiconductor layer 163 and the third p-type semiconductor layer 167.

Accordingly, light L3 incident on the boundary layer 161 from the active layer 150 and the first p-type semiconductor layer 163 may pass (as light L4) through the boundary layer 161 after being refracted at an angle greater than an angle of incidence thereof.

On the other hand, the thickness of the boundary layer 161 may be less than the thickness of one pair of barrier layer and well layer constituting the active layer 150 and may be less than the thickness of a single barrier layer.

Furthermore, light L5 incident on the second p-type semiconductor layer 165 from the first p-type semiconductor layer 163 and the third p-type semiconductor layer 167 may pass (as light L6) through the second p-type semiconductor layer 165 after being refracted at an angle greater than an angle of incidence thereof. Thus, light scattered inside the epi-growth layer can increase the length of the optical paths L4, L6 passing through the boundary layer 161 and the second p-type semiconductor layer 165, whereby light mixing of different wavelengths can occur inside the semiconductor layer.

Herein, since the index of refraction does not change with thickness, the effective index of refraction may be considered as a unique index of refraction of each material excluding a thickness factor of each layer, and for multiple layers, an average of the indices of refraction of the multiple layers may be considered as the effective index of refraction.

The light emitting device 100 according to the embodiment may further include a distributed Bragg reflector (DBR) in which first material layers each having a low index of refraction and second material layers each having a high index of refraction are alternately stacked one above another.

Figure 7A:
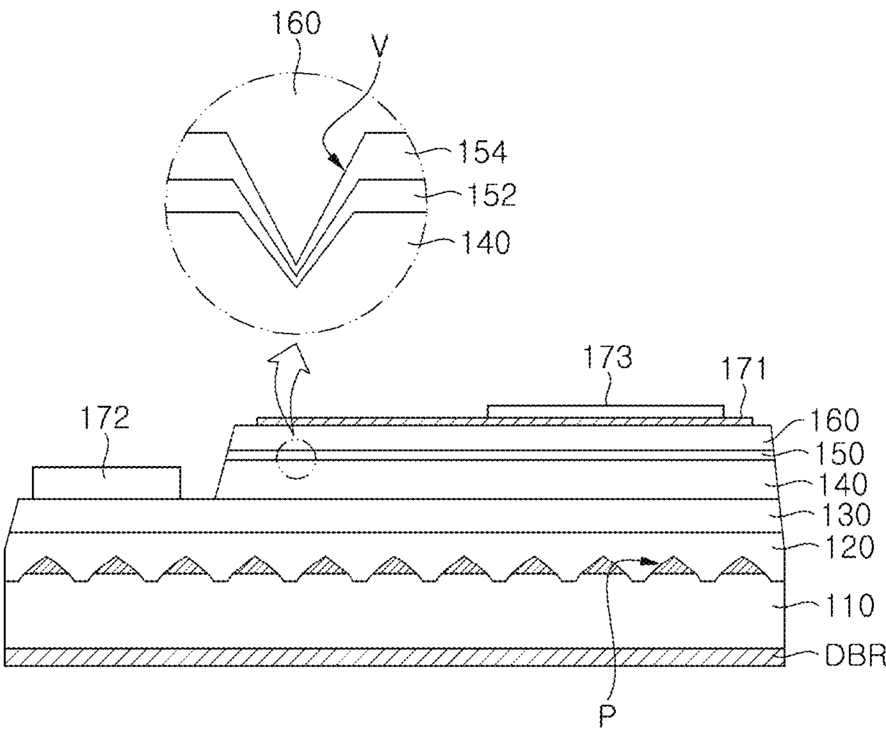
FIG. 7A and FIG. 7B are cross-sectional views of a light emitting device according to one embodiment of the present invention.
Figure 7B:
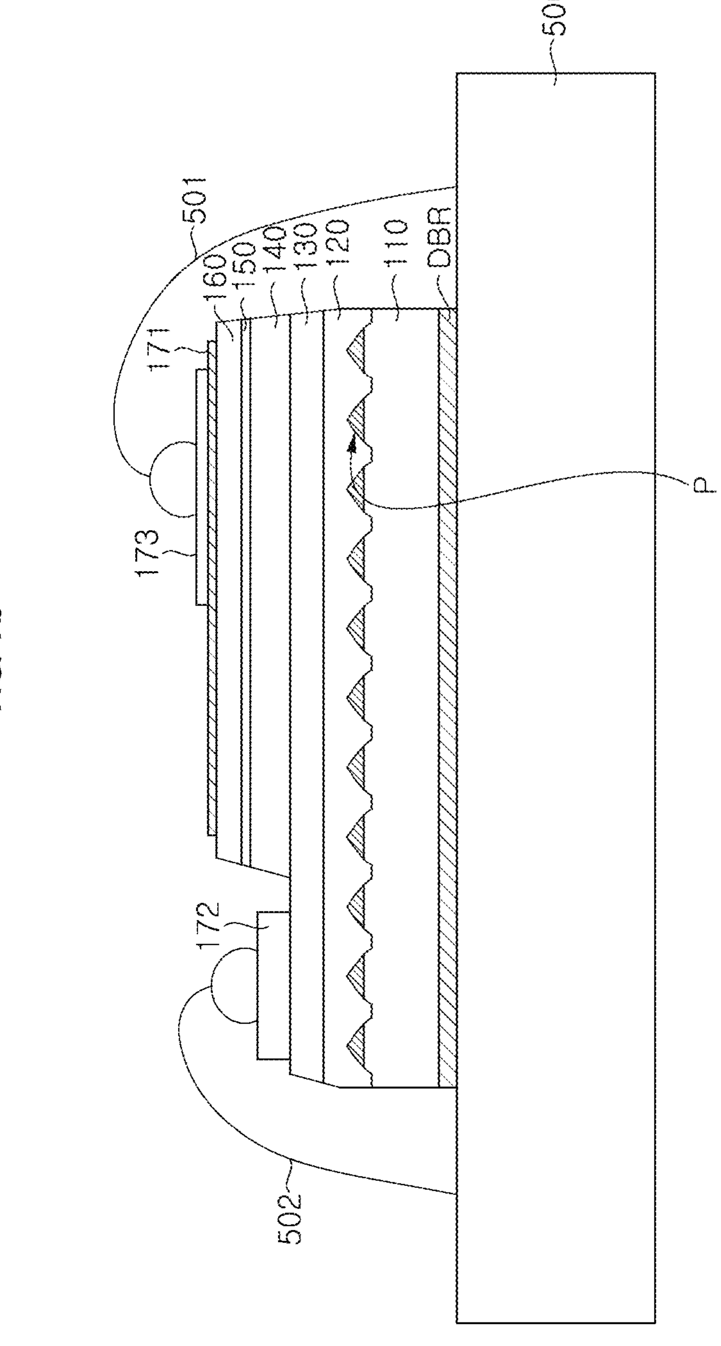
Figure 8A:
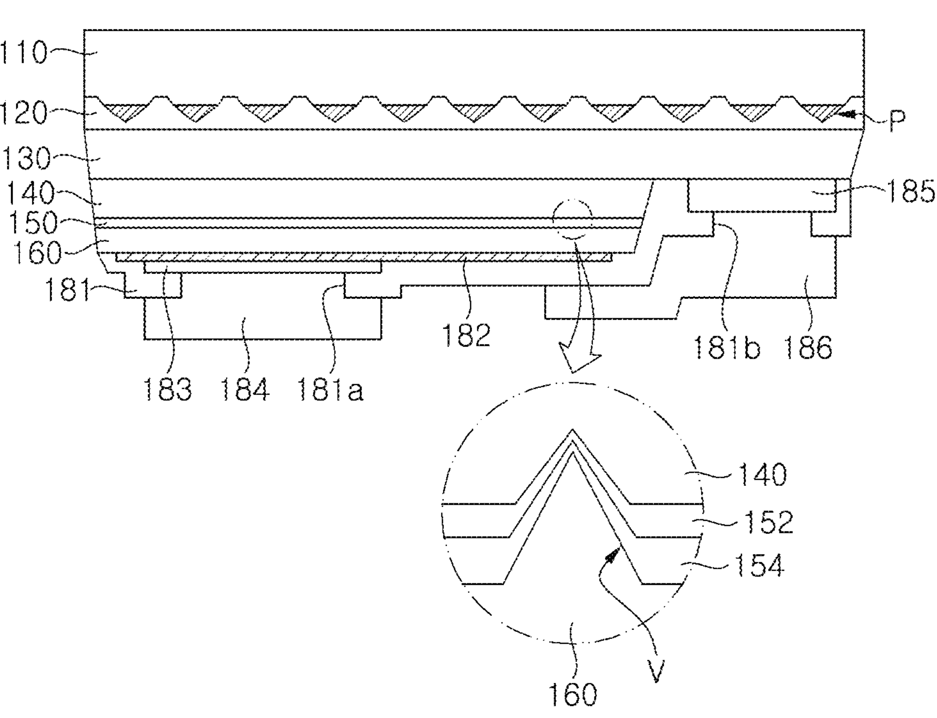

The distributed Bragg reflector DBR may be disposed at any location so long as the distributed Bragg reflector is disposed on one side of the semiconductor layer to reflect light emitted from the active layer 150. Although FIG. 7A and FIG. 7B show an example in which the distributed Bragg reflector (DBR) is disposed on a lower surface of the substrate 110 and is configured to reflect light incident on the substrate 110 in an upward direction so as to be emitted outside, it is apparent that the distributed Bragg reflector (DBR) may be disposed in various locations depending on an extraction direction of light. In other words, when the light emitting device 100 is a flip-chip type as shown in FIG. 8A and FIG. 8B, the distributed Bragg reflector (DBR) may be formed to a constant thickness (for example, 3 micrometers) on a surface, on which an electrode is formed, and a distributed Bragg reflector (DBR) structure may be provided on an insulation layer 181 for forming the electrode.

In the distributed Bragg reflector (DBR), the first material layer may be an $SiO_2$ layer having a low index of refraction and the second material layer may be a $TiO_2$ layer having a high index of refraction, without being limited thereto.

The material, index of refraction and thickness of the distributed Bragg reflector (DBR) may be determined in consideration of the optical path and light extraction efficiency through combination of the index of refraction/thickness of each layer in the light emitting device 100, the width and depth of the V-shaped grooves V, and the protrusions P on the upper surface of the substrate 110.

Figure 8B:
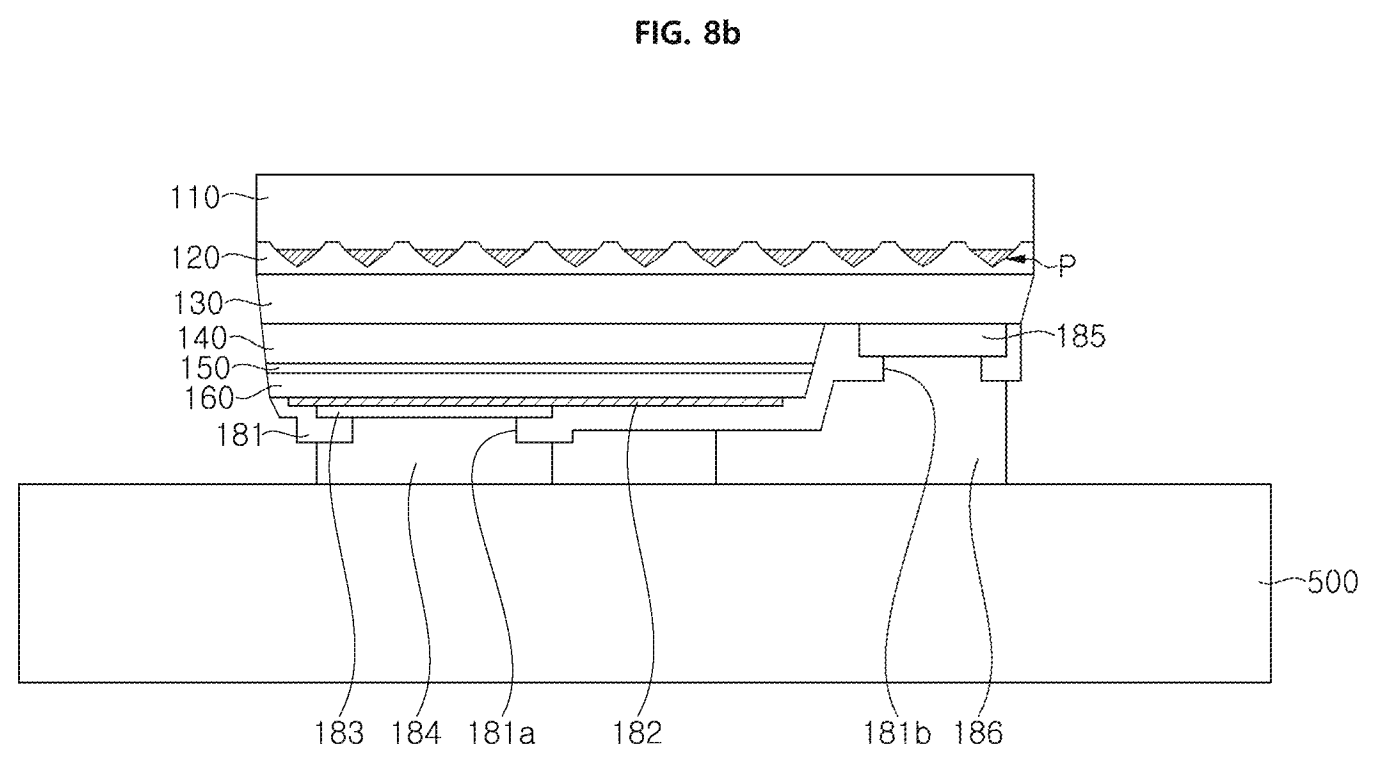

For example, referring to FIG. 8B, when the insulation layer 181 constitutes the distributed Bragg reflector (DBR), or when an additional distributed Bragg reflector (DBR) is formed separately from the insulation layer 181, the thickness of the distributed Bragg reflector DBR may be in the range of 50% to 250% of the height H1 of the second protrusion P2 of the protrusion P described above. Alternatively, the thickness of the distributed Bragg reflector DBR may be in the range of 40% to 200% of the maximum width M of the second protrusion P2. Here, the width W of the upper end of the V-shaped groove V may be in the range of 5% to 30% of the distributed Bragg reflector (DBR). In addition, the overall thickness L of the active layer 150 may be in the range of 5% to 30% of the distributed Bragg reflector (DBR). In addition, the thickness of the boundary layer 161 may be less than the thickness of the pair of first and second material layers constituting the distributed Bragg reflector (DBR).

Furthermore, the distributed Bragg reflector (DBR) may be formed of the same material as or a different material than the second protrusion P2.

FIG. 4 illustrates energy bandgaps according to the quantum well structure for each layer in the light emitting device 100 shown in FIG. 1.

FIG. 1 and FIG. 4 illustrates the epitaxial growth structure and the energy bandgap of the light emitting device according to the embodiment, in which the light control layer 140 includes the seed layer 142, the second super-lattice layer 144, the 1-1st super-lattice layer 146, and the 1-2nd super-lattice layer 148; the active layer 150 includes the first sub-active layer 152 and the second sub-active layer 154; the boundary layer 161 is formed on the active layer 150, and the first to fourth p-type semiconductor layers 163, 165, 167, 169 are formed on the boundary layer 161. Since FIG. 4 illustrates all of the components that may be optionally added to the light emitting device 100, it is apparent that embodiments of the present invention may include modifications in which some of the components optionally added to the light emitting device 100 are omitted.

In FIG. 4, the energy bandgap of the second super-lattice layer 144 may be greater than those of the seed layer 142 and the 1-1st super-lattice layer 146, and the average energy bandgap of the 1-1st super-lattice layer 146 may be greater than that of the 1-2nd super-lattice layer 148. In addition, the average energy bandgap of the 1-2nd super-lattice layer 148 may be greater than that of the first sub-active layer 152, and the average energy bandgap of the first sub-active layer 152 may be greater than that of the second sub-active layer 154. Here, the second super-lattice layer 144 may have an indium content of 2% to 5%, the first super-lattice layer 146, 148 may have an indium content of 5% to 8%, the first sub-active layer 152 may have an indium content of 14% to 20%, and the second sub-active layer 154 may have an indium content of 20% to 30%. The content of indium may gradually increase from the second super-lattice layer 144 to the second sub-active layer 154.

Thus, since the energy bandgap gradually decreases from the second super-lattice layer 144 to the second sub-active layer 154, the V-shaped groove V generated from the seed layer 142 and formed by sequentially stacking the super-lattice layers 144, 146, 148 and the active layer 150 may also have a gradually decreasing energy bandgap. Here, the average bandgap can be considered as an average of the bandgap per unit thickness of the well layer and the bandgap per unit thickness of the barrier layer.

Thus, the effective index of refraction of the layers constituting the V-shaped groove V may gradually increase. Accordingly, the distributed Bragg reflector (DBR) may have a multilayer structure including two or more layers with different effective indices of refraction.

Accordingly, light emitted from the active layer 150 may be reflected by the V-shaped groove V and emitted upwards without being absorbed, thereby effectively improving light extraction efficiency. Herein, since the index of refraction does not change with thickness, the effective index of refraction can be considered as a unique index of refraction of each material excluding a thickness factor of each layer, and for multiple layers, an average of the indices of refraction of the multiple layers may be considered as the effective index of refraction.

As such, since the energy bandgap gradually decreases from the second super-lattice layer 144 to the second sub-active layer 154 and the V-shaped groove V is formed by these layers having a gradually decreasing energy bandgap, it is possible to provide a light emitting device having high brightness and high efficiency while protecting a light emitting layer within multiple active layers from ESD.

On the other hand, the average energy bandgap of the boundary layer 161 may be greater than that of the light control layer 142, 144, 146, 148 and the active layer 150. In addition, the average energy bandgap of the boundary layer 161 may be greater than those of the first p-type semiconductor layer 163 and the second p-type semiconductor layer 165.

The average energy bandgap of the first p-type semiconductor layer 163 may be less than that of the second p-type semiconductor layer 165.

The average energy bandgap of the second p-type semiconductor layer 165 may be greater than that of the third p-type semiconductor layer 167 and the average energy bandgap of the third p-type semiconductor layer 165 may be less than that of the fourth p-type semiconductor layer 169.

Thus, the average energy bandgap of the boundary layer 161 may be greater than that of the p-type semiconductor layer 160 and the boundary layer 161 may have the highest energy bandgap among all the layers.

Such configuration of the average energy bandgap within the boundary layer 161 and the p-type semiconductor layers 163, 165, 167, 169 may allow layers with high resistance to be disposed on the V-shaped grooves V. As the layers having high resistance are disposed on the upper portion of the V-shaped grooves V, the active layer 150 including the V-shaped grooves V may be subjected to electrostatic passivation to improve anti-ESD characteristics that can protect the light emitting layer in the multiple active layers from ESD.

Next, FIG. 7A is a cross-sectional view of the light emitting device 100 according to the embodiment of the present invention.

Referring to FIG. 7A, in the light emitting device 100, a contact electrode 171 for ohmic contact may be disposed on the p-type semiconductor layer 160 and a p-electrode pad 173 may be disposed on the contact electrode 171. It should be understood that FIG. 7*a* shows one example of the electrode structure and the contact electrode 171 may be omitted.

Further, an n-electrode pad 172 may be formed on the n-type semiconductor layer 130 of the light emitting device 100. The n-electrode pad 172 and the p-electrode pad 173 may be electrically connected to the outside via wires, respectively.

Next, FIG. 8A is a cross-sectional view of a light emitting device 100 according to another embodiment of the present invention.

In the light emitting device 100, a contact electrode 182 for ohmic contact may be disposed on one surface of the p-type semiconductor layer 160 and a p-electrode pad 183 may be disposed on the contact electrode 182. However, it should be understood that other implementations are possible and the contact electrode 182 may be omitted.

Further, an n-electrode pad 185 may be formed on one surface of the n-type semiconductor layer 130. The insulation layer 181 may be disposed in some upper regions of the p-electrode pad 183 and the n-electrode pad 185.

The insulation layer 181 may cover the p-type semiconductor layer 160 such that the p-type semiconductor layer 160 is not exposed. Connection electrodes 184, 186 may be connected to the p-electrode pad 183 and the n-electrode pad 185 through openings 181*a*, 181*b* of the insulation layer 181 to electrically connect the p-electrode pad 183 and the n-electrode pad 185 to the outside, respectively. For example, the connection electrodes 184, 186 may serve as bump pads to allow bonding to a printed circuit board (PCB).

Figure 9A:
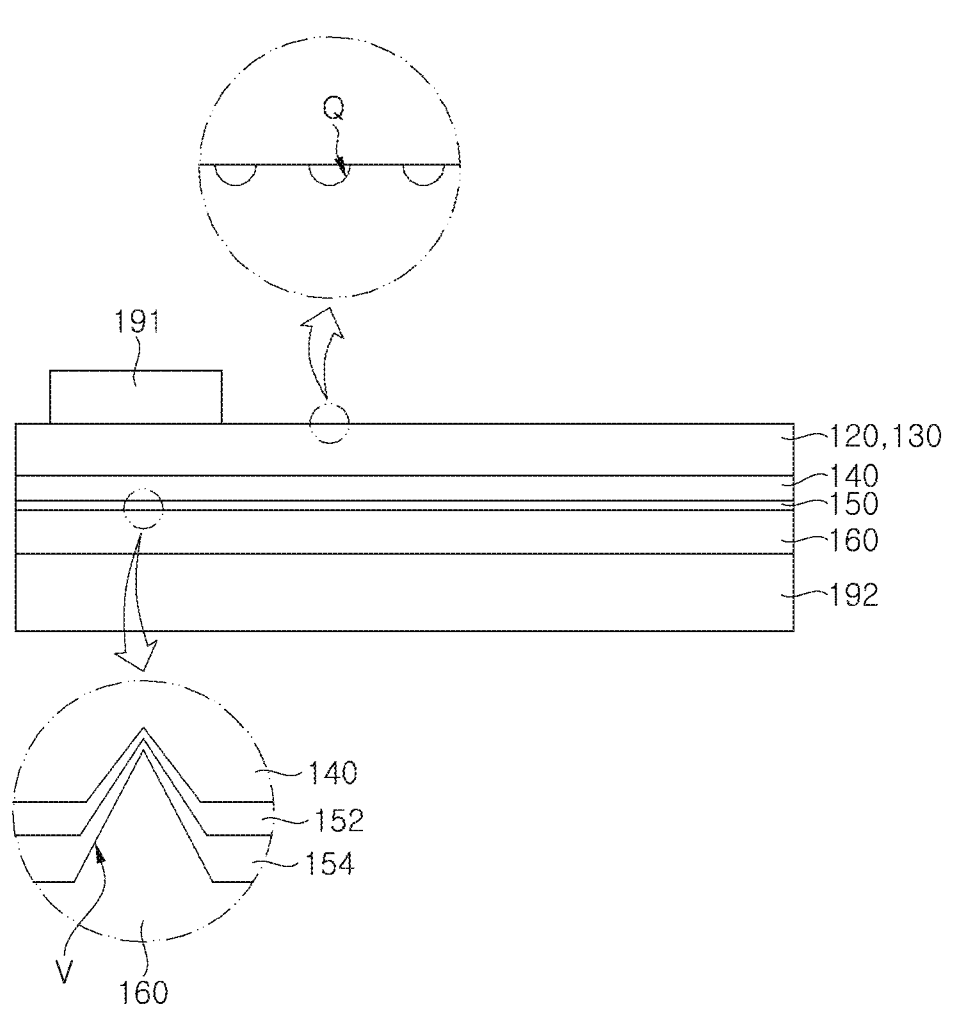
FIG. 9A and FIG. 9B are cross-sectional views of a light emitting device according to a further embodiment of the present invention.
Figure 9B:
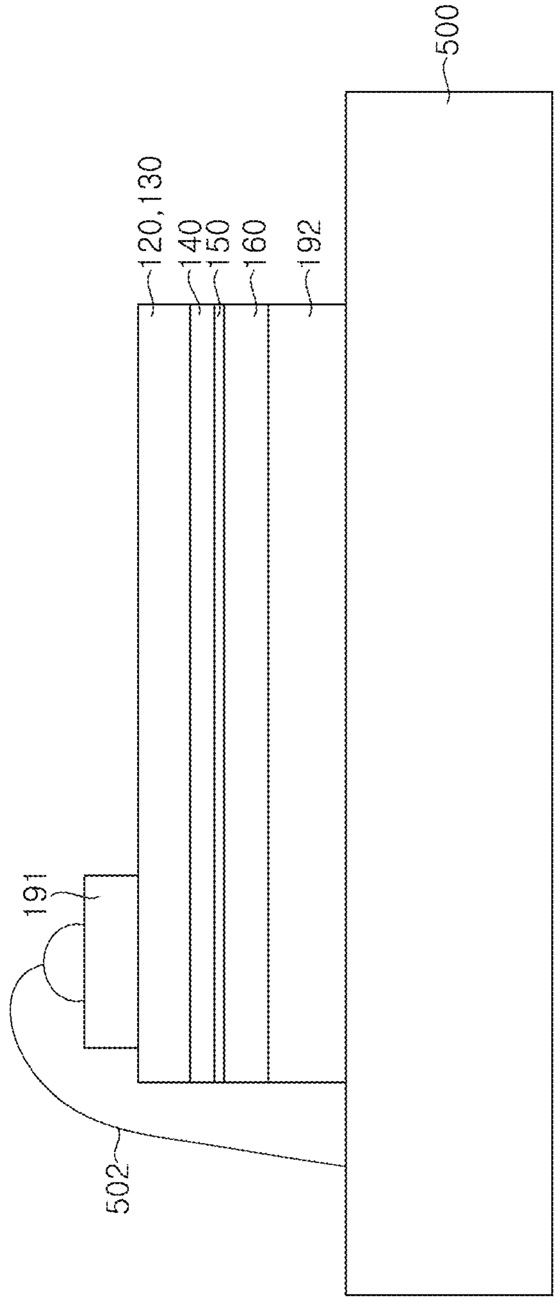

Next, FIG. 9B is a cross-sectional view of a light emitting device 100 according to a further embodiment of the present invention.

In the light emitting device 100, light generated from the active layer 150 may be emitted outside through the n-type semiconductor layer 130. Here, light emitted from the second sub-active layer 154 may pass through the first sub-active layer 152 to be incident on the n-type semiconductor layer 130 and may be emitted outside after passing through the n-type semiconductor layer 130.

Here, the n-type semiconductor layer 130 may have a structure in which the substrate 110 for growth is removed to expose the buffer layer 120 or the n-type semiconductor layer 130 through a removed portion of the substrate 110, and may include a roughness Q on a surface thereof.

Light generated from the active layer may be scattered or dispersed by the roughness Q of the n-type semiconductor layer 130 to improve light extraction. The roughness Q may be evenly or unevenly formed. When a molding layer including a small amount of wavelength conversion material is formed on the light emitting device 100, the molding layer may have an advantage of preventing variation in light conversion efficiency in different regions due to excessive concentration of wavelength conversion particles between the roughnesses Q.

A light emitting apparatus including the light emitting device 100 as shown in FIG. 7A, FIG. 8A and FIG. 9A may be provided with a circuit substrate 500 under the light emitting device 100 and may be electrically connected to the circuit substrate 500 through wires 501, 502 and connection electrodes 184, 186, 191, 192 electrically connected to the n-electrode pad and the p-electrode pad, as shown in FIG. 7B, FIG. 8B and FIG. 9B.

Alternatively, a wavelength conversion layer including wavelength conversion particles may be disposed on an upper surface of the light emitting device 100 shown in FIG. 7B, FIG. 8B, and FIG. 9B.

Alternatively, the light emitting device 100 may emit white light without the wavelength conversion layer thereon.

Accordingly, the light emitting devices 100 according to the embodiments of the present invention may provide a light emitting apparatus capable of realizing anti-ESD characteristics.

Figure 10A:
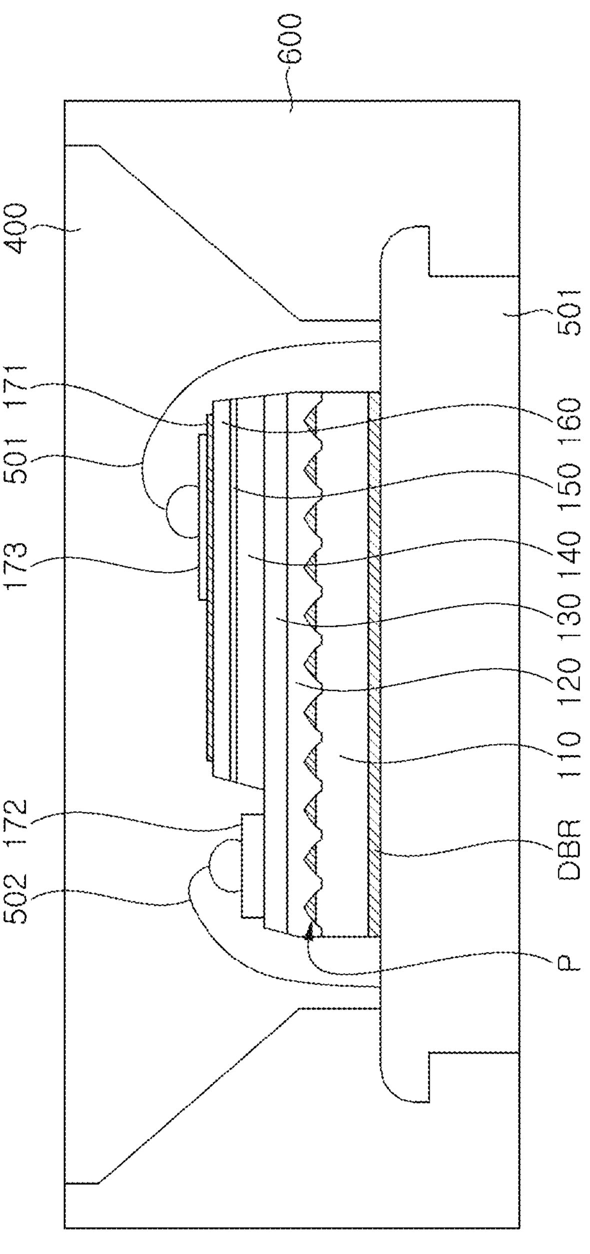
FIG. 10A and FIG. 10B are cross-sectional views of a light emitting apparatus according to one embodiment of the present invention.
Figure 11A:
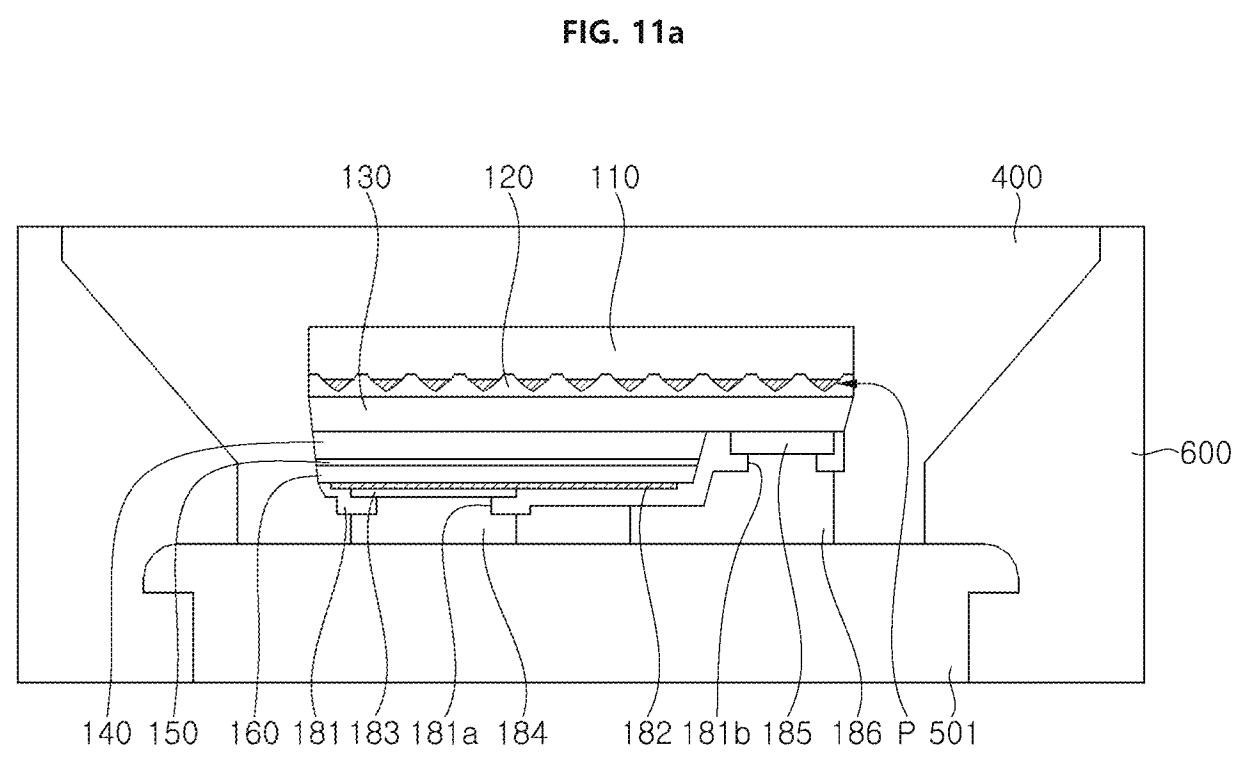
Figure 11B:
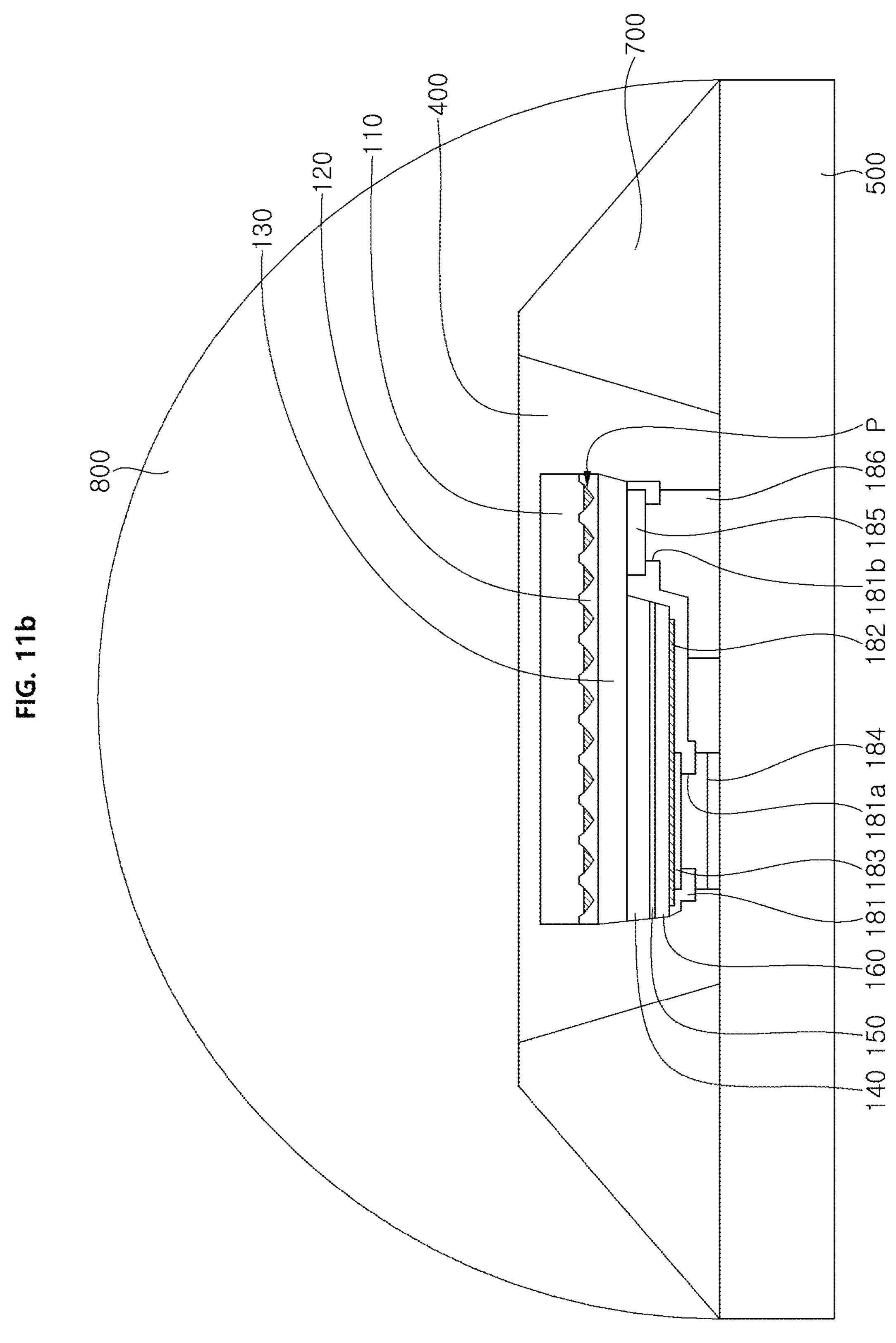
Figure 12A:
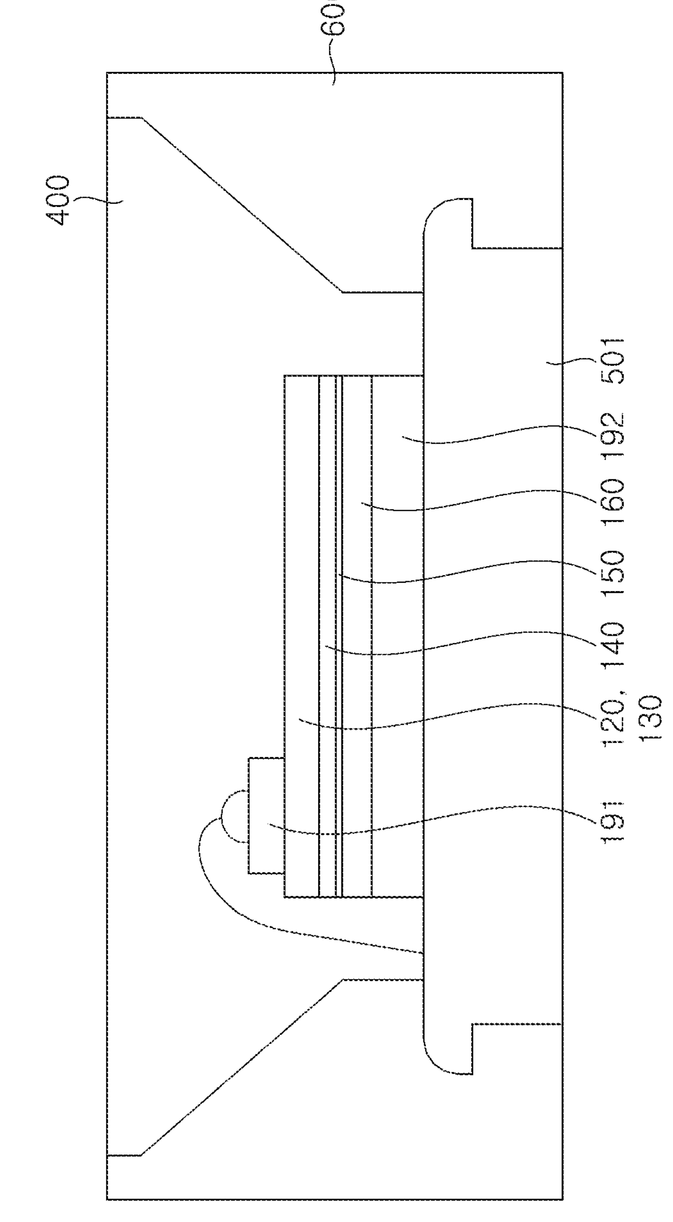
FIG. 12A and FIG. 12B are cross-sectional views of a light emitting apparatus according to a further embodiment of the present invention.

FIG. 10A, FIG. 11A, and FIG. 12A show a light emitting apparatus on which the light emitting device 100 is mounted, according to another embodiment of the present invention.

The light emitting apparatus may include a circuit substrate 501 disposed under the light emitting device 100 and may further include a lead portion 600 spaced apart from one surface of the light emitting device 100. In addition, the light emitting apparatus may further include a molding portion 400 that covers at least some region on the upper surface of the light emitting device 100. The lead portion 600 may extend from a lower portion of the circuit substrate 501 to an upper portion of the molding portion 400. In addition, when viewed from above, the circuit substrate 501 and the lead portion 600 may be disposed to overlap each other in a region where the circuit substrate 501 adjoins the lead portion 600. In addition, the circuit substrate 501 may include a protrusion formed on the circuit substrate 501 to be directed toward the lead portion 600, whereby the circuit substrate 501 can be more stably secured to the lead portion 600. The molding portion 400 may further include wavelength conversion particles.

Figure 10B:
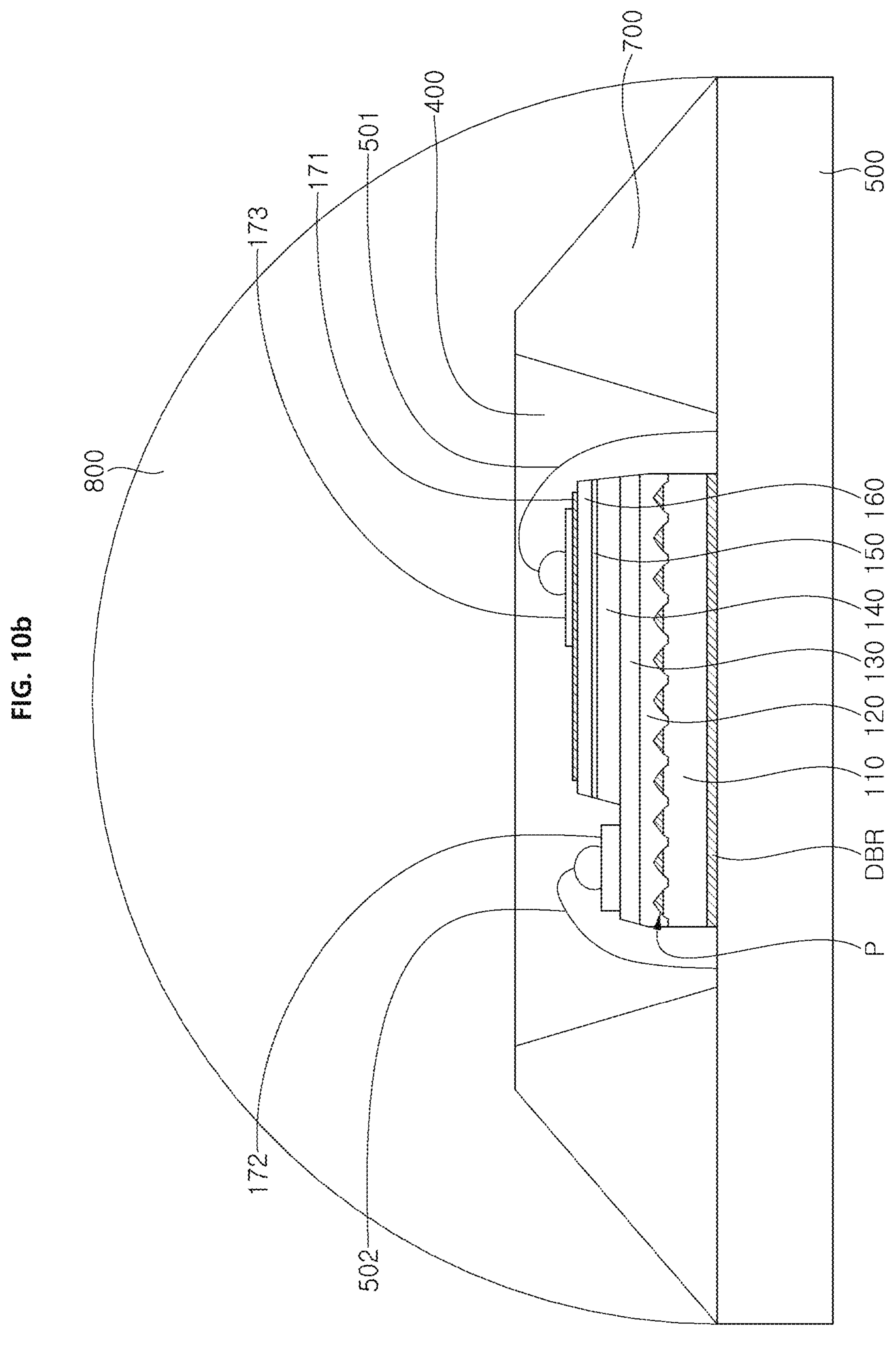
Figure 12B:
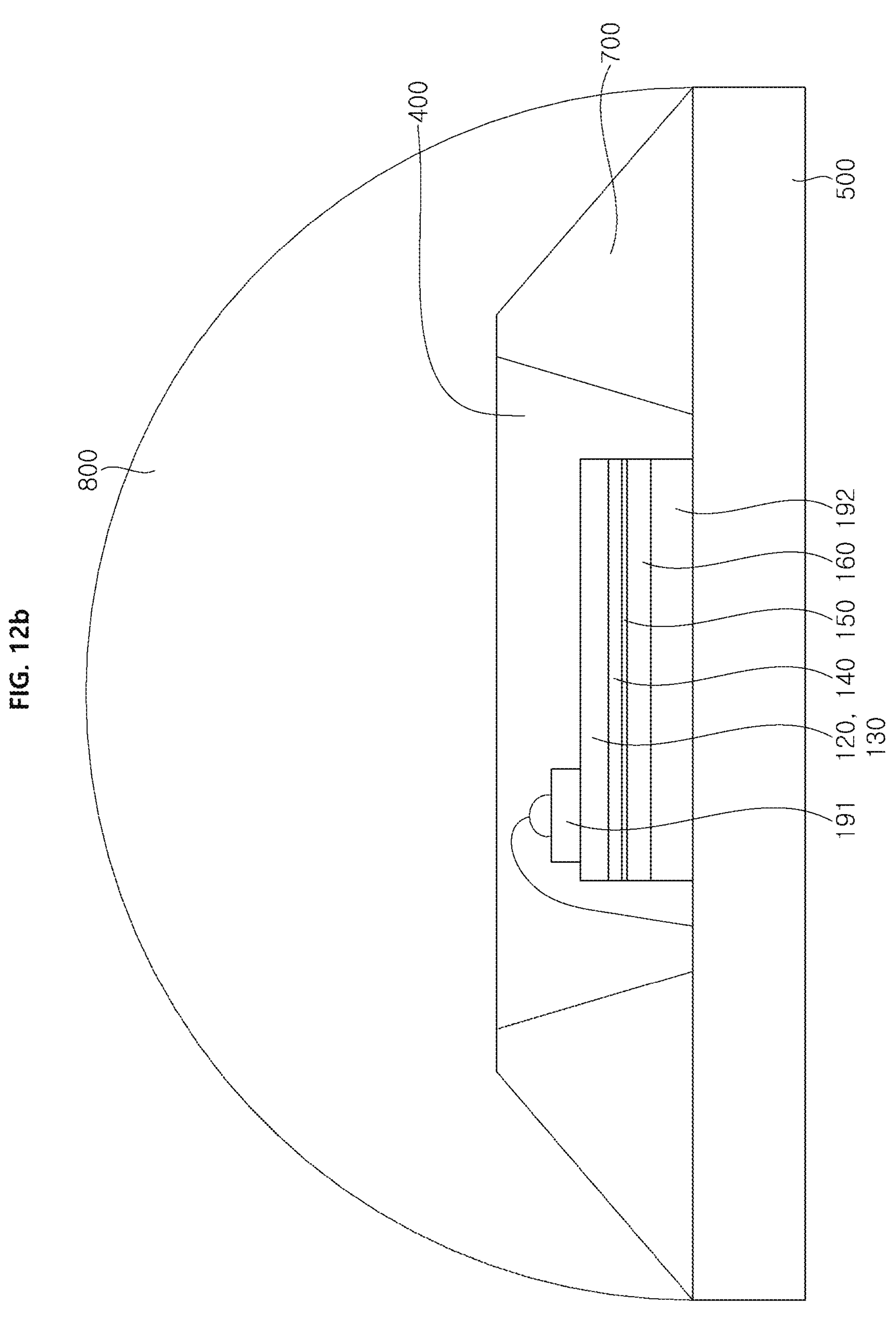

FIG. 10B, FIG. 11B, and FIG. 12B show a light emitting apparatus on which the light emitting device 100 is mounted, according to a further embodiment of the present invention.

Here, the light emitting apparatus may include a circuit substrate 500 disposed under the light emitting device 100 and a lead portion 700 spaced apart from one surface of the light emitting device 100. In addition, the light emitting apparatus may further include a molding portion 400 that covers at least some region on the upper surface of the light emitting device 100.

The molding portion 400 may be further provided with a lens portion 800 thereon, without being limited thereto. Alternatively, the molding portion 400 and the lens portion 800 may be omitted.

When the light emitting apparatus includes the lens portion 800, a distal end of the lead portion 700 adjacent to the lens portion 800 may be formed in the form of a beveled surface or a curved surface depending on the shape of the lens portion 800.

On the other hand, as described above, the light emitting device 100 according to the embodiment may include the V-shaped grooves V extending upwards from the seed layer 142. Next, the shape and function of the V-shaped grooves V will be described in more detail.

The maximum width W of the V-shaped grooves W may be the same as or different from the depth D thereof. For example, the maximum width W and the depth D of the V-shaped grooves V may be in the range of 300 nm to 350 nm, more preferably 150 nm to 300 nm. In addition, the V-shaped grooves V may be disposed between the seed layer 142 and the p-type semiconductor layer 160, and may be irregularly or regularly disposed.

The V-shaped groove V is formed by sequentially stacking the light control layer 140 having an indium content of 2% to 8%, the first sub-active layer 152 having an indium content of 14% to 20%, and the second active layer 154 having an indium content of 20% to 30%, that is, by sequentially stacking the layers to have a gradually increasing indium content, whereby the light emitting layer in the active layer 150 can be protected from ESD.

Referring again to FIG. 1, in the V-shaped groove V, the first sub-active layer 152 and the second sub-active layer 154 may overlap each other with reference to a horizontal line. In other words, when an imaginary horizontal line N is drawn in the middle of the V-shaped groove V, at least part of the first sub-active layer 152 and at least part of the second sub-active layer 154 may overlap along the horizontal line N in some regions.

However, in a region where the V-shaped groove V is not formed, when an imaginary horizontal line (not shown) is drawn, the first and second sub-active layers 152, 154 cannot exist simultaneously on the imaginary horizontal line (not shown).

Vertically, the first and second sub-active layers 152, 154 may overlap each other in all regions. Accordingly, as the V-shaped groove V is formed, the first and second sub-active layers 152, 154 may overlap each other in a region of the V-shaped groove V in horizontal and vertical directions.

As such, as a structure with two peak wavelengths is formed in a region that overlaps both horizontally and vertically within the nitride semiconductor, light having two peak wavelengths can be effectively mixed when emitted, thereby enabling clear light emission.

For example, light with a peak wavelength generated and emitted from the first sub-active layer 152 may be in the blue spectrum and light with a peak wavelength generated and emitted from the second sub-active layer 154 may be in the green spectrum, wherein the light in the blue spectrum light is sufficiently mixed with the light in the green spectrum in the horizontally and vertically overlapping region of the V-shaped groove V, thereby realizing clear light.

The following Table 1 shows experimental data for evaluation of anti-ESD characteristics by applying a reverse voltage to the light emitting device 100 according to the embodiment of the present invention.

TABLE 1

| Item | | Prior art Failed sample | Present invention Failed sample |
|---|---|---|---|
| Total number of samples | | 20 | 20 |
| Applied reverse voltage | 0 V | 0 | 0 |
| | 100 V | 0 | 0 |
| | . . . | 0 | 0 |
| | 700 V | 0 | 0 |
| | 800 V | 2 | 0 |
| | 900 V | 2 | 0 |
| | 1,000 V | 2 | 0 |
| | 1,100 V | 0 | 0 |
| | 1,200 V | 5 | 0 |
| | 1,300 V | 8 | 0 |
| | 1,400 V | 1 | 0 |
| | 1,500 V | 0 | 0 |
| | . . . | 0 | 0 |
| | 2,000 V | 0 | 0 |
| Total number of failed samples | | 20 | 0 |

Two prior art samples failed when reverse voltages of 800 V, 900 V, and 1,000 V were applied, and five prior art samples failed when a reverse voltage of 1,200 V was applied. In addition, eight prior art samples failed when a reverse voltage of 1,300 V was applied, and one prior art sample failed when a reverse voltage of 1,400 V was applied.

In other words, all 20 prior art samples failed at a reverse voltage of 1,400 V or less, and it could be seen that anti-ESD capability of the prior art samples was 800 V or less. On the other hand, since the light emitting device 100 according to the embodiment was determined to be normal at a reverse voltage of 2,000 V or less for all 20 samples, it could be seen that anti-ESD capability of the light emitting device 100 was 2,000 V or more.

In particular, the light emitting device 100 according to the present invention can maximize light mixing and extraction efficiency using reflection and refraction within the epitaxial layers based on differences in index of refraction between layers (the light control layers 142, 144, 146, 148, the active layer 152, 154, TB, the boundary layer 161, and the p-type semiconductor layers 163, 165, 167, 169) constituting the epi-growth layer, relationships between the index of refraction/shape/size of the protrusion P formed on one side of the substrate 110, and relationships between the shape/size of the V-shaped groove V formed by the light control layers 142, 144, 146, 148. Furthermore, the light emitting device 100 according to the present invention can achieve the maximum light extraction efficiency while ensuring extraction of uniform light through combination of the distributed Bragg reflector (DBR).

Although some exemplary embodiments have been described herein with reference to the accompanying drawings, it should be understood that various modifications and changes can be made by those skilled in the art or by a person having ordinary knowledge in the art without departing from the spirit and scope of the present invention, as defined by the claims and equivalents thereto.

Therefore, the scope of the present invention should be defined by the appended claims and equivalents thereto rather than by the detailed description of the invention.

LIST OF REFERENCE NUMERALS

110: Substrate
120: Buffer layer
130: First conductivity type semiconductor layer
150: Active layer
160: Second conductivity type semiconductor layer

The invention claimed is:

1. A light emitting apparatus comprising:

a light emitting device and a circuit substrate on which the light emitting device is mounted, wherein the light emitting device comprises a first conductivity type semiconductor layer, an active layer disposed on the first conductivity type semiconductor layer, and a second conductivity type semiconductor layer disposed on the active layer, the active layer comprising a plurality of sub-active layers having different energy bandgaps, wherein the plurality of sub-active layers are sequentially disposed from up to down and have gradually increasing energy bandgaps with decreasing distance to a light emission surface.

2. The light emitting apparatus according to claim 1, further comprising a tunnel barrier layer located between adjacent sub-active layers, wherein the tunnel barrier layer has a lower effective index of refraction than the adjacent sub-active layers.

3. The light emitting apparatus according to claim 1, wherein the active layer comprises:

a first sub-active layer formed on the first conductive-type semiconductor layer and having a first energy bandgap; and a second sub-active layer formed on the first sub-active layer and having a second energy bandgap different from the first energy bandgap, the second sub-active layer having a greater indium content than the first sub-active layer.

4. The light emitting apparatus according to claim 1, wherein the light emitting device further comprises a light control layer disposed between the first conductive-type semiconductor layer and the active layer and a light control structure located within the active layer and formed by the light control layer.

5. The light emitting apparatus according to claim 1, wherein the first conductivity type semiconductor layer is an n-type semiconductor layer, the second conductivity type semiconductor layer is a p-type semiconductor layer, and the light emitting device further comprises a boundary layer disposed between the active layer and the p-type semiconductor layer and having Al.

6. The light emitting apparatus according to claim 5, wherein the active layer has a multi-quantum well structure in which barrier layers and well layers are alternately stacked one above another, and the boundary layer has a smaller thickness than one pair of barrier layer and well layer.

7. The light emitting apparatus according to claim 5, wherein the active layer has a multi-quantum well structure in which barrier layers and well layers are alternately stacked one above another, and the boundary layer has a smaller thickness than the barrier layer.

8. The light emitting apparatus according to claim 5, wherein the light emitting device further comprises a light control layer disposed between the first conductive-type semiconductor layer and the active layer and a light control structure located within the active layer and formed by the light control layer, the light control structure being a V-shaped groove having a V-shaped cross-section across the active layer.

9. The light emitting apparatus according to claim 8, wherein the active layer comprises:

a first sub-active layer formed on the first conductive-type semiconductor layer and having a first energy bandgap; and a second sub-active layer formed on the first sub-active layer and having a second energy bandgap different from the first energy bandgap, a maximum width of the V-shaped groove being greater than a thickness of the first sub-active layer.

10. The light emitting apparatus according to claim 8, wherein the active layer comprises:

a first sub-active layer formed on the first conductive-type semiconductor layer and having a first energy bandgap; and a second sub-active layer formed on the first sub-active layer and having a second energy bandgap different from the first energy bandgap, a maximum width of the V-shaped groove being greater than a thickness of the second sub-active layer.

11. The light emitting apparatus according to claim 8, wherein the active layer has a thickness ranging from 50% to 150% of a maximum width of the V-shaped groove.

12. The light emitting apparatus according to claim 8, wherein the boundary layer covers a surface of the V-shaped groove to form a boundary between the V-shaped groove and the p-type semiconductor layer.

13. The light emitting apparatus according to claim 5, wherein an effective index of refraction of the boundary layer is less than an effective index of refraction of the p-type semiconductor layer.

14. The light emitting apparatus according to claim 1, further comprising:

a substrate for growth of the first conductive-type semiconductor layer, wherein a plurality of protrusions is formed on one surface of the substrate.

15. The light emitting apparatus according to claim 14, wherein each of the protrusions comprises a first protrusion integrally formed with the substrate and protruding from the one surface of the substrate, and a second protrusion disposed on the first protrusion.

16. The light emitting apparatus according to claim 15, wherein the active layer has a thickness ranging from 7% to 15% of a height of the second protrusion.

17. The light emitting apparatus according to claim 15, wherein the active layer has a thickness ranging from 2% to 10% of a maximum width of the second protrusion.

18. The light emitting apparatus according to claim 15, wherein the second protrusion has a different index of refraction than the first protrusion.

19. The light emitting apparatus according to claim 15, wherein the light emitting device further comprises a distributed Bragg reflector in which first material layers and second material layers having a higher index of refraction than the first material layers are alternately stacked one above another, the distributed Bragg reflector having a thickness ranging from 50% to 250% of a height of the second protrusion.

20. A light emitting device comprising:

an n-type semiconductor layer, an active layer disposed on the n-type semiconductor layer, and a p-type semiconductor layer disposed on the active layer, wherein the active layer comprises a plurality of sub-active layers having different energy bandgaps and a tunnel barrier layer between adjacent sub-active layers, wherein the plurality of sub-active layers are sequentially disposed from up to down and have gradually increasing energy bandgaps with decreasing distance to a light emission surface.

* * * * *